(12) United States Patent
Cheng et al.

(10) Patent No.: US 10,249,709 B2
(45) Date of Patent: Apr. 2, 2019

(54) STACKED NANOSHEET FIELD EFFECT TRANSISTOR DEVICE WITH SUBSTRATE ISOLATION

(71) Applicant: International Business Machines Corporation, Armonk, NY (US)

(72) Inventors: Kangguo Cheng, Schenectady, NY (US); Juntao Li, Cohoes, NY (US); Geng Wang, Stormville, NY (US); Qintao Zhang, Mt. Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/789,325

(22) Filed: Oct. 20, 2017

(65) Prior Publication Data

US 2018/0219064 A1 Aug. 2, 2018

Related U.S. Application Data

(62) Division of application No. 15/422,572, filed on Feb. 2, 2017, now Pat. No. 9,881,998.

(51) Int. Cl.
*H01L 21/02* (2006.01)
*H01L 29/06* (2006.01)
(Continued)

(52) U.S. Cl.
CPC .... *H01L 29/0649* (2013.01); *H01L 21/02192* (2013.01); *H01L 21/02565* (2013.01);
(Continued)

(58) Field of Classification Search
CPC ......... H01L 21/02192; H01L 21/02603; H01L 21/465; H01L 29/0673; H01L 29/66545; H01L 29/78618; H01L 29/78696
See application file for complete search history.

(56) References Cited

U.S. PATENT DOCUMENTS 7,135,699 B1 11/2006 Atanackovic
7,923,743 B2 4/2011 Bojarczuk, Jr. et al.
(Continued)

OTHER PUBLICATIONS

List of IBM Patents or Patent Applications Treated as Related, Oct. 20, 2017.

*Primary Examiner* — Khiem D Nguyen
(74) *Attorney, Agent, or Firm* — Vazken Alexanian; Ryan, Mason & Lewis, LLP

(57) ABSTRACT

Nanosheet FET devices having substrate isolation layers are provided, as well as methods for fabricating nanosheet FET devices with substrate isolation layers. For example, a semiconductor device includes a nanosheet stack structure formed on a substrate, which includes a rare earth oxide (REO) layer formed on the substrate, and a semiconductor channel layer disposed adjacent to the REO layer. A metal gate structure is formed over the nanosheet stack structure, and a gate insulating spacer is disposed on sidewalls of the metal gate structure, wherein end portions of the semiconductor channel layer are exposed through the gate insulating spacer. Source/drain regions are formed in contact with the exposed end portions of the semiconductor channel layer. A portion of the metal gate structure is disposed between the semiconductor channel layer and the REO layer, wherein the REO layer isolates the metal gate structure from the substrate.

12 Claims, 32 Drawing Sheets

(51) Int. Cl.
    *H01L 29/66*     (2006.01)
    *H01L 21/465*     (2006.01)
    *H01L 29/423*     (2006.01)
    *H01L 29/786*     (2006.01)

(52) U.S. Cl.
    CPC ...... H01L 21/02603 (2013.01); H01L 21/465 (2013.01); H01L 29/0673 (2013.01); H01L 29/42392 (2013.01); H01L 29/66545 (2013.01); H01L 29/66742 (2013.01); H01L 29/78618 (2013.01); H01L 29/78696 (2013.01)

(56) References Cited

U.S. PATENT DOCUMENTS

| | | |
|---|---|---|
| 8,753,942 B2 | 6/2014 | Kuhn et al. |
| 9,281,198 B2 | 3/2016 | Adam et al. |
| 9,362,355 B1 * | 6/2016 | Cheng ............... H01L 29/66742 |
| 9,502,518 B2 * | 11/2016 | Liu .................... H01L 29/42364 |
| 9,620,590 B1 | 4/2017 | Bergendahl et al. |
| 9,704,995 B1 * | 7/2017 | Schultz ............... H01L 29/7856 |
| 2008/0318439 A1 * | 12/2008 | Ito ......................... C23C 16/405 438/778 |
| 2012/0261761 A1 * | 10/2012 | Wang ............. H01L 21/823857 257/368 |
| 2014/0145312 A1 | 5/2014 | Wang et al. |
| 2014/0264280 A1 * | 9/2014 | Kim ..................... H01L 29/785 257/29 |
| 2015/0123215 A1 | 5/2015 | Obradovic et al. |
| 2015/0295084 A1 | 10/2015 | Obradovic et al. |
| 2016/0071729 A1 | 3/2016 | Hatcher et al. |
| 2016/0111284 A1 | 4/2016 | Kittl et al. |
| 2017/0194214 A1 | 7/2017 | Doris et al. |

\* cited by examiner

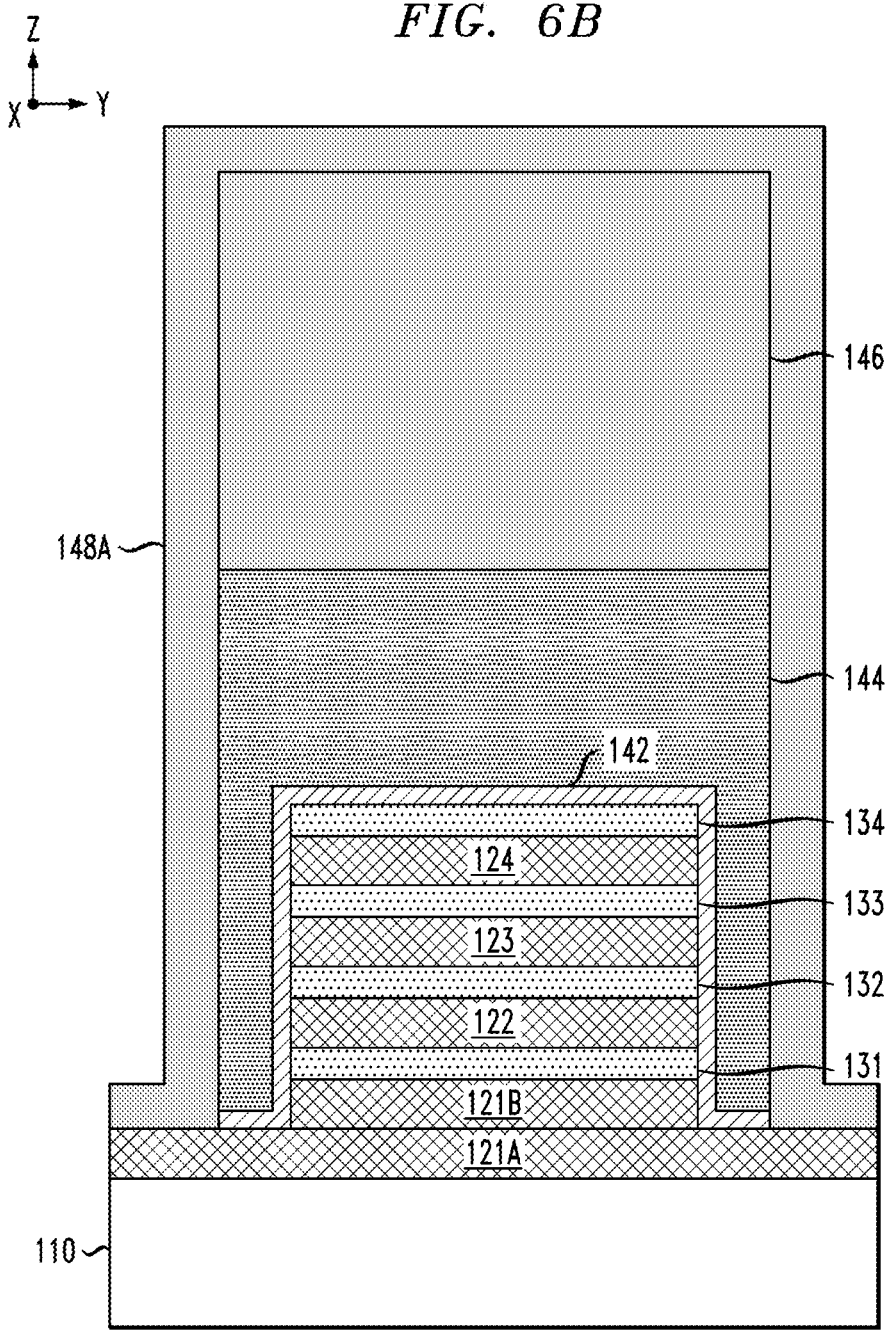

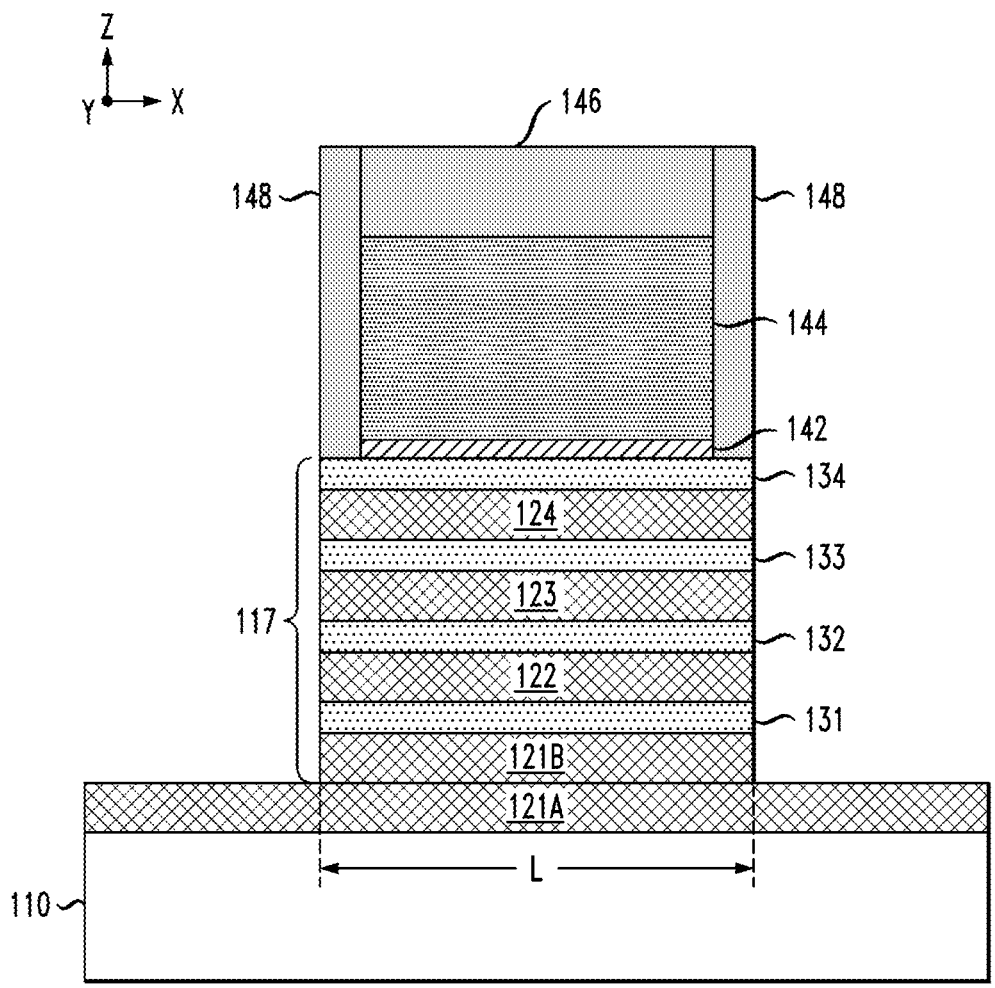

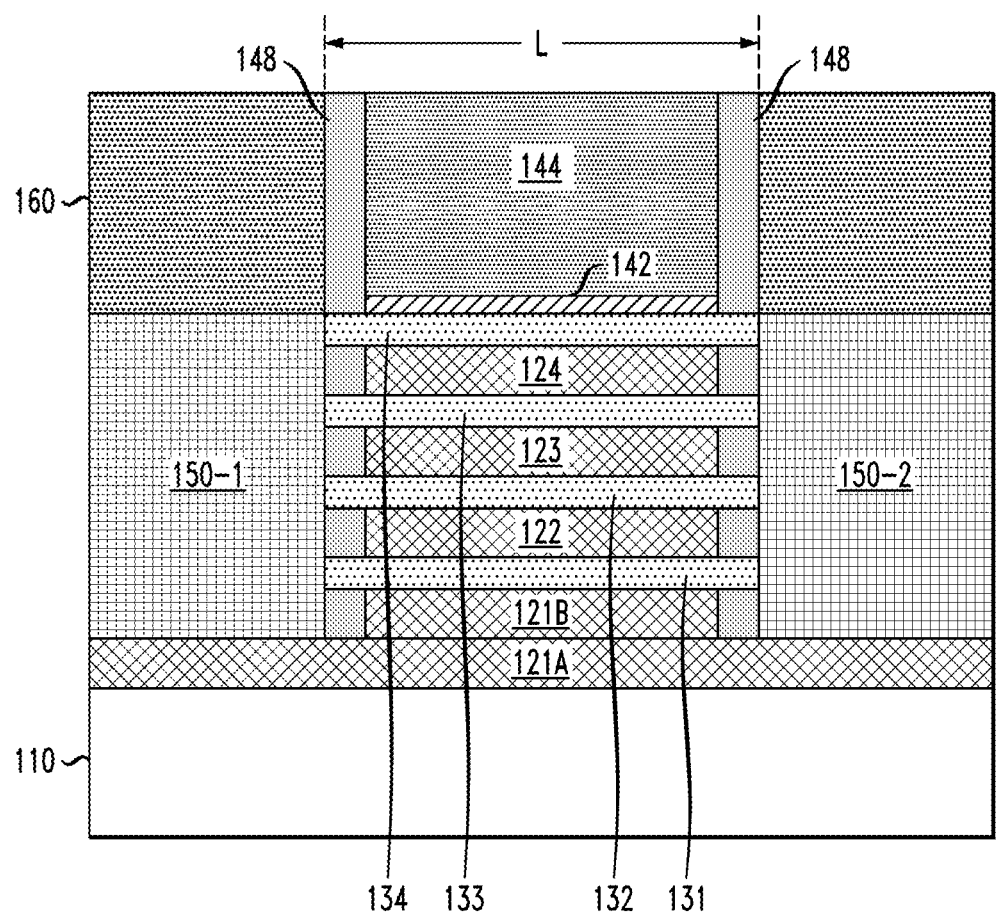

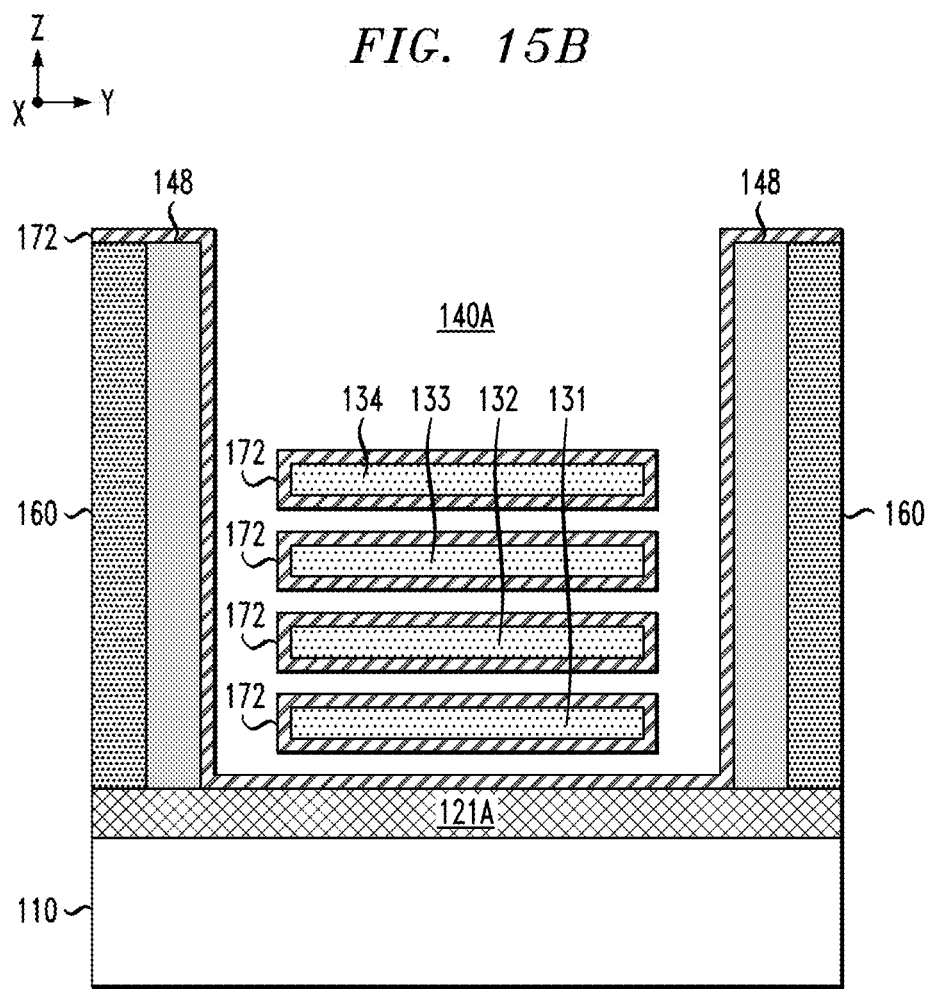

STACKED NANOSHEET FIELD EFFECT TRANSISTOR DEVICE WITH SUBSTRATE ISOLATION

TECHNICAL FIELD

This disclosure relates generally to semiconductor fabrication techniques and, in particular, to structures and methods for fabricating nanosheet metal-oxide-semiconductor field-effect transistor (MOSFET) devices.

BACKGROUND

Continued innovations in semiconductor process technologies are enabling higher integration densities and device scaling. As the semiconductor industry moves towards the 7 nm technology node and beyond, planar and non-planar semiconductor FET device structures must be scaled to smaller dimensions to provide increased device width per footprint area. In this regard, nanosheet (or nanowire) FET devices are considered to be a viable option for continued CMOS scaling. In general, a nanosheet FET device comprises a device channel which comprises one or more nanosheet layers in a stacked configuration, wherein each nanosheet layer has a vertical thickness that is substantially less than the width of the nanosheet layer. A common gate structure is formed above and below each nanosheet layer in a stacked configuration, thereby increasing the FET device width (or channel width), and thus the drive current, for a given footprint area.

One challenge in fabricating nanosheet FET devices is the ability to effectively isolate the nanosheet FET devices from an underlying semiconductor substrate. For example, depending on the FET structure, a parasitic transistor channel is formed in the semiconductor substrate below a bottom of the stacked nanosheet structure, thereby resulting in unwanted current leakage and parasitic capacitance. To suppress leakage current due to the parasitic transistor channel, the semiconductor substrate below the parasitic transistor channel can be heavily doped. However, this approach can lead to increased junction leakage between source/drain regions and the heavily doped semiconductor substrate, as well as parasitic capacitance between the gate and the heavily doped semiconductor substrate.

SUMMARY

Embodiments of the invention include nanosheet FET devices having substrate isolation layers, and methods for fabricating nanosheet FET device with substrate isolation layers. In one embodiment, a method is provided for fabricating a semiconductor device. A nanosheet stack structure is formed on a semiconductor substrate, wherein the nanosheet stack structure comprises a rare earth oxide (REO) layer formed on the semiconductor substrate, and a semiconductor channel layer formed on the REO layer. A dummy gate structure is formed over the nanosheet stack structure. A gate insulating spacer is formed on vertical sidewalls of the dummy gate structure, wherein end portions of the semiconductor channel layer are exposed through the gate insulating spacer. A first source/drain region and a second source/drain region is formed in contact with a respective one of the end portions of the semiconductor channel layer exposed through the gate insulating spacer. An insulating layer is formed to cover the first and second source/drain regions. The dummy gate structure is removed to form a gate recess region that exposes a portion of the nanosheet stack structure surrounded by the gate insulating spacer. A portion of the REO layer, which is exposed in the gate recess region, is etched to form a space between the semiconductor channel layer and the REO layer. A metal gate structure is formed within the gate recess region, wherein a portion of the metal gate structure is disposed in the space between the semiconductor channel layer and the REO layer, wherein the REO layer isolates the metal gate structure from the semiconductor substrate.

Another embodiment includes a semiconductor device, which comprises a nanosheet stack structure formed on a semiconductor substrate. The nanosheet stack structure comprises a REO layer formed on the semiconductor substrate, and a semiconductor channel layer disposed adjacent to the REO layer. The semiconductor device further comprises a metal gate structure formed over the nanosheet stack structure, and a gate insulating spacer disposed on vertical sidewalls of the metal gate structure, wherein end portions of the semiconductor channel layer are exposed through the gate insulating spacer. A first source/drain region and a second source/drain region is formed in contact with a respective one of the end portions of the semiconductor channel layer exposed through the gate insulating spacer. A portion of the metal gate structure is disposed between the semiconductor channel layer and the REO layer, wherein the REO layer isolates the metal gate structure from the semiconductor substrate.

Other embodiments will be described in the following detailed description of embodiments, which is to be read in conjunction with the accompanying figures.

BRIEF DESCRIPTION OF THE DRAWINGS

FIGS. 2 through 17 schematically illustrate a method for fabricating the semiconductor device of FIGS. 1A and 1B, according to an embodiment of the invention, wherein:

FIG. 2 is a cross-sectional schematic side view of the semiconductor device at an intermediate stage of fabrication in which a stack of nanosheet layers comprising alternating REO layers and semiconductor channel layers is formed on a semiconductor substrate.

FIGS. 6A and 6B are cross-sectional schematic side views of the semiconductor structure shown in FIGS. 5A and 5B, respectively, after depositing a conformal layer of dielectric material;

FIG. 8 is a cross-sectional schematic side view of the semiconductor structure shown in FIG. 7A after recessing exposed portions of the nanosheet stack structure down to a bottom REO layer;

FIG. 9 is a cross-sectional schematic side view of the semiconductor structure shown in FIG. 8 after laterally recessing exposed sidewall surfaces of the REO layers of the nanosheet stack structure to form recesses in the sidewalls of the nanosheet stack structure;

FIG. 10 is a cross-sectional schematic side view of the semiconductor structure shown in FIG. 9 after filling the recesses with dielectric material to form embedded gate insulating spacers on the sidewalls of the nanosheet stack structure;

FIG. 11 is a cross-sectional schematic side view of the semiconductor structure shown in FIG. 10 after forming source/drain regions;

FIG. 12 is a cross-sectional schematic side view of the semiconductor structure shown in FIG. 11 after forming an insulating layer to cover the source/drain regions and removing the hard mask to expose the dummy gate structure;

FIGS. 15A and 15B are cross-sectional schematic side views of the semiconductor structure shown in FIGS. 14A and 14B, respectively, after depositing conformal layers of gate dielectric material and work function metal material to form high-k metal gate stack structures on exposed surfaces of the semiconductor channel layers in the gate recess region;

FIG. 17 is a cross-sectional schematic side view of the semiconductor structure shown in FIG. 16A after planarizing the semiconductor structure, recessing an upper portion of the metal gate structure, and forming a gate capping layer on the recessed surface of the metal gate structure.

FIGS. 20 and 21 schematically illustrate an alternative process flow for fabricating the nanosheet FET device of FIG. 19, wherein:

FIG. 20 is a cross-sectional schematic side view of an intermediate semiconductor structure which is formed after removing a dummy gate structure to form a gate recess region; and FIG. 21 is a cross-sectional schematic side view of the semiconductor structure of FIG. 20 after etching an upper portion of an REO layer and etching away sacrificial REO layers of a nanosheet stack to release semiconductor channel layers.

DETAILED DESCRIPTION

Figure 1A:
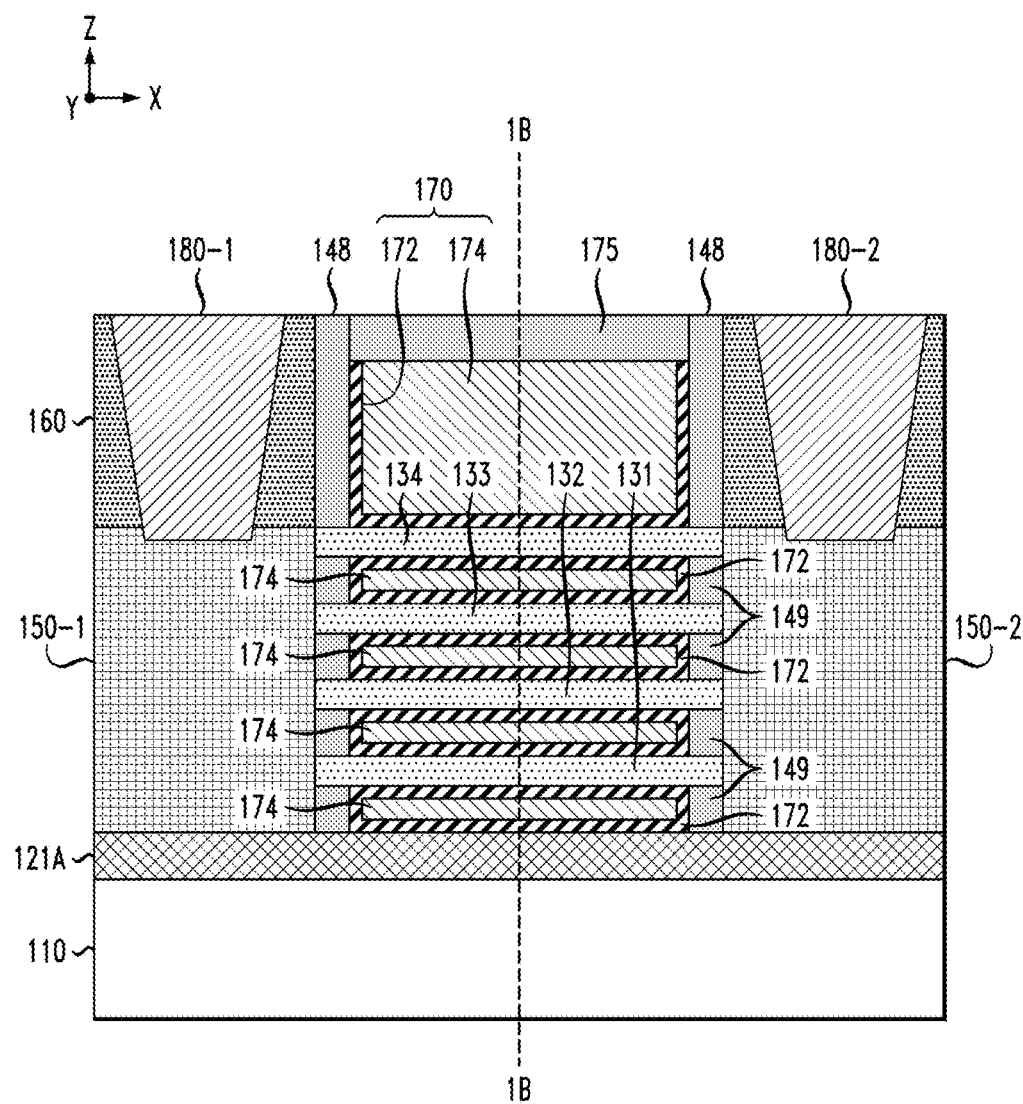
FIGS. 1A and 1B are schematic views of a semiconductor device comprising a nanosheet FET device, according to an embodiment of the invention.

Embodiments of the invention will now be described in further detail with regard to semiconductor devices comprising nanosheet FET devices having substrate isolation layers, and methods for fabricating nanosheet FET device with substrate isolation layers. As explained in further detail below, semiconductor fabrication techniques according to embodiments of the invention utilize rare earth oxide (REO) material layers as sacrificial layers for fabricating nanosheet stack structures of nanosheet FET devices and for electrically isolating metal gate structures and source/drain regions of the nanosheet FET devices from a semiconductor substrate. The REO isolation layers prevent/suppress junction leakage from the doped source/drain regions into the semiconductor substrate and prevent/suppress parasitic capacitance between the metal gate structure of the nanosheet FET device and the semiconductor substrate.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

To provide spatial context to the different structural orientations of the semiconductor structures shown throughout the drawings, XYZ Cartesian coordinates are shown in each of the drawings. It is to be understood that the term "vertical" as used herein denotes a Z-direction of the Cartesian coordinates shown in the drawings, and that the terms "horizontal" or "lateral" as used herein denotes an X-direction and/or Y-direction of the Cartesian coordinates shown in the drawings, which is perpendicular to the Z-direction.

Figure 1B:
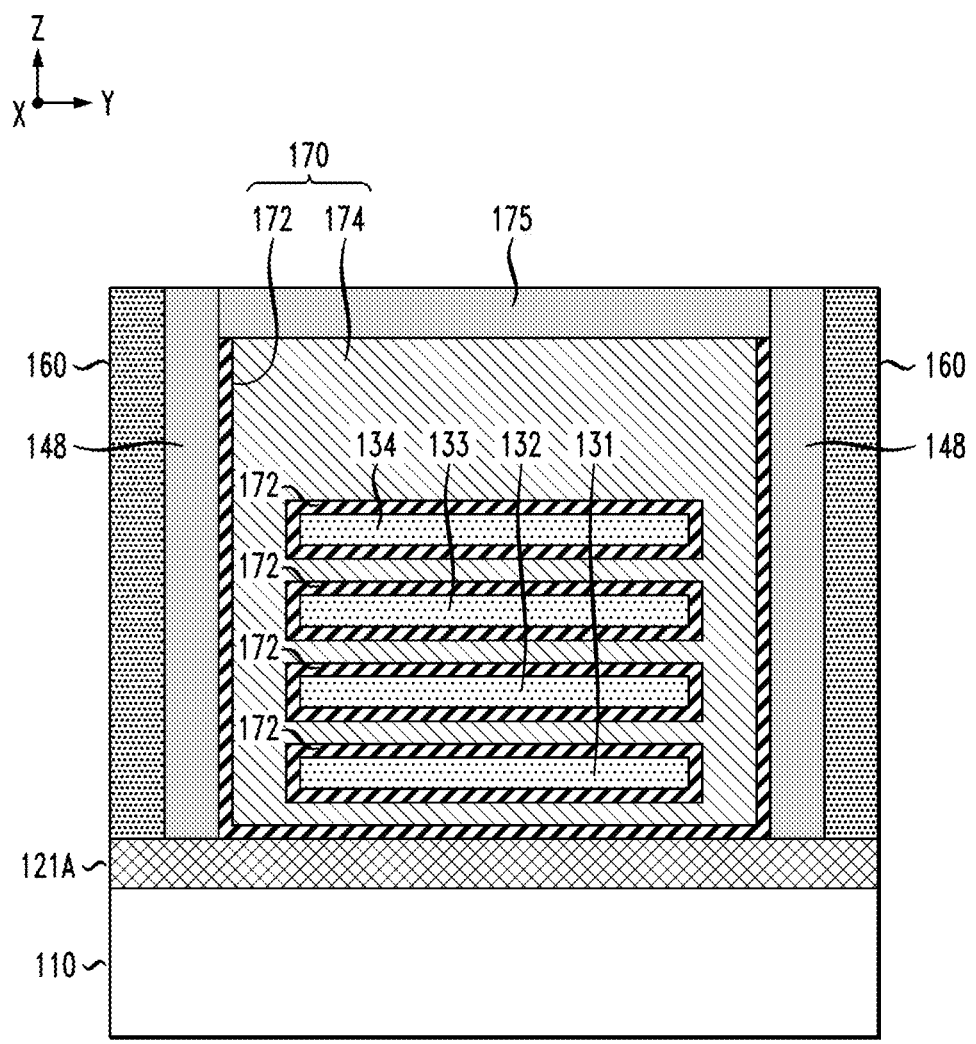

FIGS. 1A and 1B are schematic views of a semiconductor device comprising a nanosheet FET device, according to an embodiment of the invention. In particular, FIG. 1A is a schematic cross-sectional view of the semiconductor device 100 along a X-Z plane, and FIG. 1B is a cross-sectional view of the semiconductor device 100 along line 1B-1B (Y-X plane) shown in FIG. 1A. As collectively shown in FIGS. 1A and 1B, the semiconductor device 100 comprises a substrate 110, a REO layer 121A, a stack of nanosheet semiconductor channel layers 131, 132, 133, and 134, gate insulating spacers 148 and 149, source/drain regions 150-1 and 150-2, an insulating layer 160 (e.g., a PMD (pre-metal dielectric) layer of a middle-of-the-line (MOL) layer), a metal gate structure 170, and vertical source/drain contacts 180-1 and 180-2. The metal gate structure 170 comprises high-k metal gate stack structures 172 and a metal gate electrode layer 174. A gate capping layer 175 is formed on an upper surface of the metal gate structure 170. The gate insulating layers 148 and 149, and gate capping layer 175 electrically insulates the metal gate structure 170 from the surrounding elements (e.g., insulating layer 160, source/drain regions 150-1 and 150-2, etc.).

In one embodiment, each high-k metal gate stack structure 172 comprises (i) a thin conformal gate dielectric layer formed on surfaces of the nanosheet semiconductor channel layers 131, 132, 133, and 134 and (ii) a thin conformal work function metal (WFM) layer that is formed over the conformal gate dielectric layer. In another embodiment, the conformal layers 172 comprise a high-k dielectric layer, and the metallic material of the metal gate electrode layer 174 serves as a work function metal in addition to a gate electrode layer. In another embodiment, the high-k metal gate stack structures 172 have a thickness that completely fills the spaces between the semiconductor channel layers 131, 132, 133 and 134, and between the semiconductor channel layer 131 and the REO layer 121A such that there is no material of the gate electrode layer 174 disposed in such spaces. In this embodiment, the gate electrode layer 174 would only be present above the nanosheet stack (i.e., above semiconductor channel layer 134) and possibly between the vertical gate insulating spacer 148 and the sides of the nanosheet semiconductor channel layers 131, 132, 133, and 134 (FIG. 1B).

As shown in FIG. 1A, the nanosheet semiconductor channel layers 131, 132, 133, and 134 are disposed in a stacked configuration with the end portions of the nanosheet semiconductor channel layers 131, 132, 133, and 134 extending between, and connected to, the source/drain regions 150-1 and 150-2. In one embodiment, the source/drain regions 150-1 and 150-2 comprise merged epitaxial semiconductor layers that are epitaxially grown on the end portions of the nanosheet semiconductor channel layers 131, 132, 133, and 134. As shown in FIGS. 1A and 1B, the metal gate electrode layer 174 of the metal gate structure 170 encapsulates the nanosheet semiconductor channel layers 131, 132, 133, and 134, thereby serving as a common gate structure that is formed above and below each nanosheet layer in the stacked configuration. In this configuration, the nanosheet semiconductor channel layers 131, 132, 133, and 134 collectively serve as an FET channel layer of the nanosheet FET device, thereby increasing the FET device width (or channel width), and thus the drive current of the FET device, for a given footprint area.

As further shown in FIGS. 1A and 1B, vertical source/drain contacts 180-1 and 180-2 are formed in the insulating layer 160 in contact with the respective source/drain regions 150-1 and 150-2. It is to be understood that the term "source/drain region" as used herein means that a given source/drain region can be either a source region or a drain region, depending on the application or circuit configuration. While not specifically shown in FIGS. 1A and 1B, the semiconductor device 100 would also include one or more vertical gate contacts formed in an etched opening of the gate capping layer 175 in contact with the metal gate electrode layer 174 of the metal gate structure 170. The vertical contacts 180-1 and 180-2 may be considered MOL device contacts that are formed as part of the MOL layer of the semiconductor device 100 to provide vertical contacts to the nanosheet FET device. Each vertical source/drain contact 180-1 and 180-2 may comprises a liner/barrier layer and a conductive via, as is known in the art.

In the exemplary embodiment of FIGS. 1A and 1B, the REO layer 121A serves to electrically insulate/isolate the metal gate structure 170 and the source/drain regions 150-1 and 150-2 from the substrate 110. In particular, the REO layer 121A prevents or otherwise suppresses junction leakage from the doped source/drain regions 150-1 and 150-2 into the semiconductor substrate 110. In addition, the REO layer 121A prevents or otherwise suppresses parasitic capacitance between a bottom portion of the metal gate structure 170 of the nanosheet FET device and the semiconductor substrate 110. This is contrast to conventional nanosheet FET devices in which the metal gate structure and source/drain regions are in contact with the underlying substrate, resulting in the formation of a parasitic transistor channel in the semiconductor substrate below a bottom of the stacked nanosheet structure. In addition to providing insulating/isolation functions, as explained in further detail below, REO layers are utilized as sacrificial layers for fabricating nanosheet stack structures based on special properties of REO material which allows epitaxial semiconductor channel layers to be epitaxially grown on top of REO layers, and vice versa.

Figure 2:
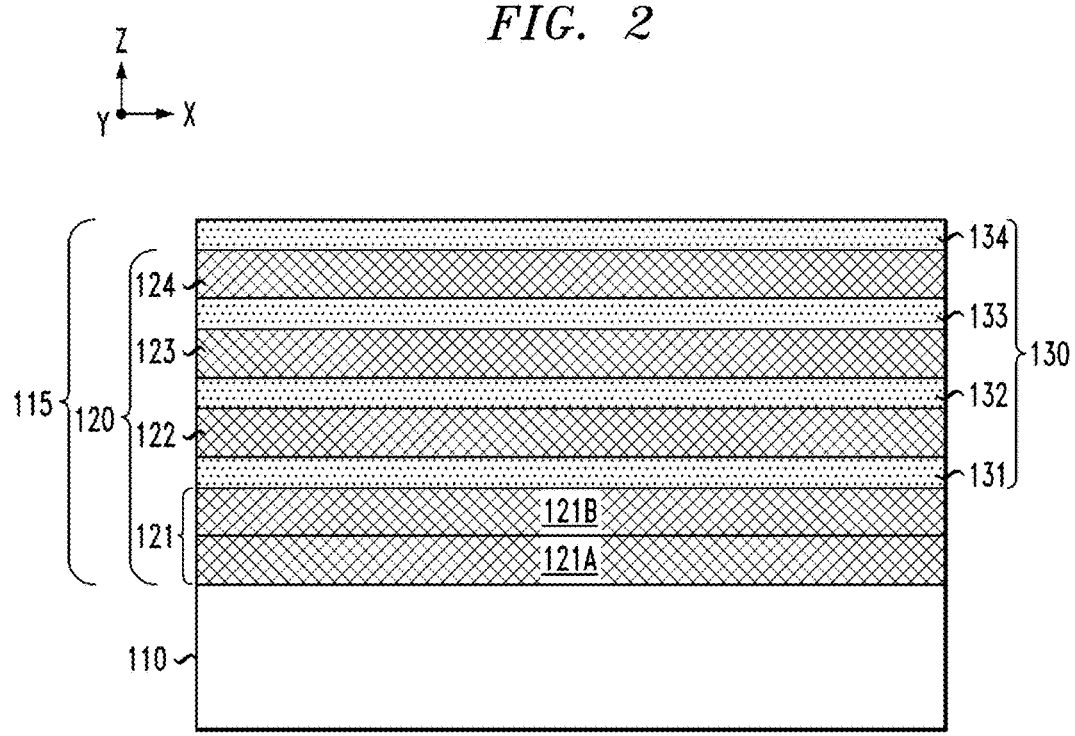

Methods for fabricating the semiconductor device 100 shown in FIGS. 1A and 1B will now be discussed in further detail with reference to FIG. 2 through FIG. 17, which schematically illustrate the semiconductor device 100 at various stages of fabrication. To begin, FIG. 2 is a cross-sectional schematic side view of the semiconductor device 100 at an intermediate stage of fabrication in which a stack of nanosheet layers 115 comprising alternating REO layers 121, 122, 123 and 124 (collectively referred to as REO layers 120), and semiconductor channel layers 131, 132, 133 and 134 (collectively referred to as semiconductor channel layers 130), is formed on a semiconductor substrate 110. While the semiconductor substrate 110 is generically illustrated in FIG. 2, the semiconductor substrate 110 may comprise one of different types of semiconductor substrate structures.

For example, in one embodiment, the semiconductor substrate 110 may comprise a bulk semiconductor substrate formed of, e.g., silicon (Si), or other types of semiconductor substrate materials that are commonly used in bulk semiconductor fabrication processes such as germanium (Ge), silicon-germanium (SiGe) alloy, silicon carbide (SiC), carbon doped Si (Si:C), silicon-germanium-carbide (SiGeC) alloy, or compound semiconductor materials (e.g. III-V and II-VI). Non-limiting examples of compound semiconductor materials include gallium arsenide (GaAs), indium arsenide (InAs), and indium phosphide (InP). In another embodiment, the semiconductor substrate 110 may comprise a SOI (silicon on insulator) substrate, which comprises an insulating layer (e.g., oxide layer) disposed between a base substrate layer (e.g., silicon substrate) and an active semiconductor layer (e.g., Si layer, SiGe layer, III-V compound semiconductor layer, etc.) in which active circuit components (e.g., FinFET devices) are formed as part of a front-end-of line (FEOL) layer.

The REO layers 120 are formed of a rare earth material such as, for example, Lanthanum (La), Cerium (Ce), Praseodymium (Pr), Neodymium (Nd), Promethium (Pm), Samarium (Sm), Europium (Eu), Gadolinium (Gd), Terbium (Tb), Dysprosium (Dy), Holmium (Ho), Erbium (Er), Thulium (Tm), Ytterbium (Yb) and Lithium (Lu), or a combination thereof. The semiconductor channel layers 130 are formed of a semiconductor material such as, for example, Si, Ge, SiGe, SiC, SiGeC, GaAs, InAs, InP, etc. In one embodiment of the invention, the REO layers 120 comprise crystalline REO layers that are epitaxially grown on top of the semiconductor material layers using known techniques. In addition, the semiconductor channel layers 120 comprise single crystal (monocrystalline) semiconductor layers that are epitaxially grown on top of the REO material layers using known methods such as CVD (chemical vapor deposition), MOCVD (metal-organic CVD), LPCVD (Low Pressure CVD), MBE (molecular beam epitaxy), VPE (vapor-phase epitaxy), LPE (liquid-phase epitaxy) or other known epitaxial growth techniques which are suitable for the given process flow. The type of materials that are utilized to form the REO layers 120 and the semiconductor channel layers 130 will depend on the desired device performance, as well as provide sufficient lattice matching between the semiconductor channel layers 120 and the REO layers 130 to ensure proper epitaxial growth of crystalline semiconductor and REO material layers.

In the example embodiment of FIG. 2, a first (or bottom) REO layer 121 comprises a multilayer REO structure comprising a first REO sublayer 121A and a second REO sublayer 121B. The first REO sublayer 121A is epitaxially grown on a surface of the semiconductor substrate 110, and the second REO sublayer 121B is epitaxially grown on the first REO sublayer 121A. Further, a first semiconductor channel layer 131 is epitaxially grown on the first REO layer 121 (e.g., on a surface of the second REO sublayer 121B), a second REO layer 122 is epitaxially grown on the first semiconductor channel layer 131, a second semiconductor channel layer is epitaxially grown on the second REO layer 122, a third REO layer 123 is epitaxially grown on the second semiconductor channel layer 132, a third semiconductor channel layer 133 is epitaxially grown on the third REO layer 123, a fourth REO layer 124 is epitaxially grown on the third semiconductor channel layer 133, and a fourth semiconductor channel layer 134 is epitaxially grown on the fourth REO layer 124. While the stack of nanosheet layers 115 is shown to include four REO layers 120 and four semiconductor channel layers 130, in other embodiments of the invention, the stack of nanosheet layers 115 can be fabricated with one or more REO layers and one or more semiconductor channel layers, depending on the target application.

As noted above, the first REO sublayer 121A serves as an isolation/insulation layer which electrically isolates/insulates the nanosheet FET device from the semiconductor substrate 110. In this regard, in one embodiment, the second REO sublayer 121B comprises a sacrificial REO material that can be etched selective to the REO material of the first REO sublayer 121A. Further, the other REO layers 122, 123 and 124 are formed of the same or similar sacrificial REO material as the second REO sublayer 121B, which allows the sacrificial REO layers 121B, 122, 123, and 124 to be etched selective to the REO sublayer 121A and thereby release the semiconductor channel layers 130 (e.g., FIGS. 14A and 14B as discussed below), while maintaining the underlying REO sublayer 121A. The use of an REO material for the REO sublayer 121A with etch properties that are different from the REO material(s) of the other REO layers 122, 123 and 124 ensures that the REO layer 121A is not etched away during various etching/patterning steps that are subsequently performed to fabricate the nanosheet FET device.

The thickness of the REO layers 121B, 122, 123 and 124 will define a size of the spacing between the semiconductor channel layers 130 and between the first semiconductor channel layer and the first REO sublayer 121A, which spaces are subsequently filled with metallic gate material following release of the semiconductor channel layers 130. In one embodiment, the semiconductor channel layers 130 are formed with a thickness which is less than a thickness of the REO layers 121B, 122, 123, and 124. For example, in one embodiment, the first REO sublayer 121A is formed with a thickness in a range of about 10 nm to about 20 nm, and the sacrificial REO layers 121B, 122, 123, and 124 are formed with a thickness in a range of about 8 nm to about 15 nm. In addition, in one embodiment of the invention, each semiconductor channel layer 131, 132, 133, and 134 is formed with a thickness in a range of about 5 nm to about 10 nm, although the semiconductor channel layer 131, 132, 133, and 134 can be formed with other thickness ranges, depending on the application.

Figure 3A:
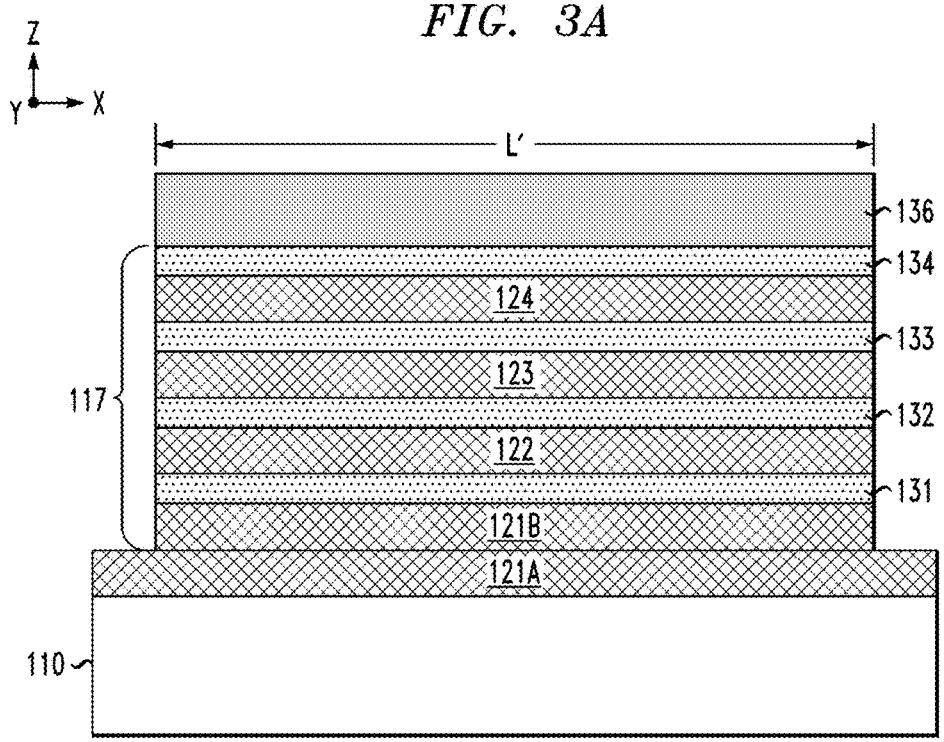
FIGS. 3A, 3B, and 3C are schematic views of the semiconductor structure of FIG. 2 after patterning the stack of nanosheet layers to form a nanosheet stack structure.
Figure 3B:
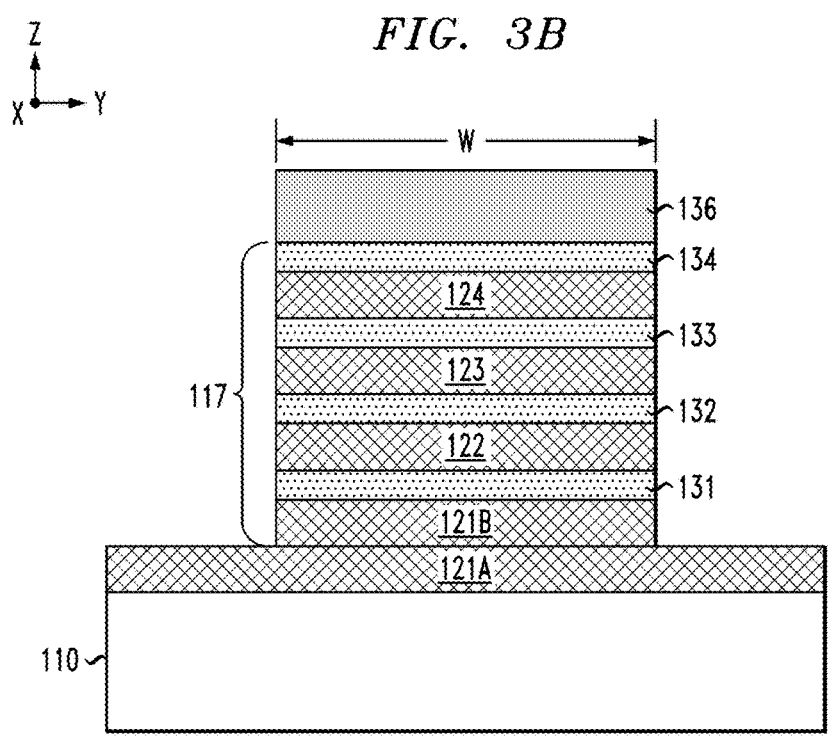
Figure 3C:
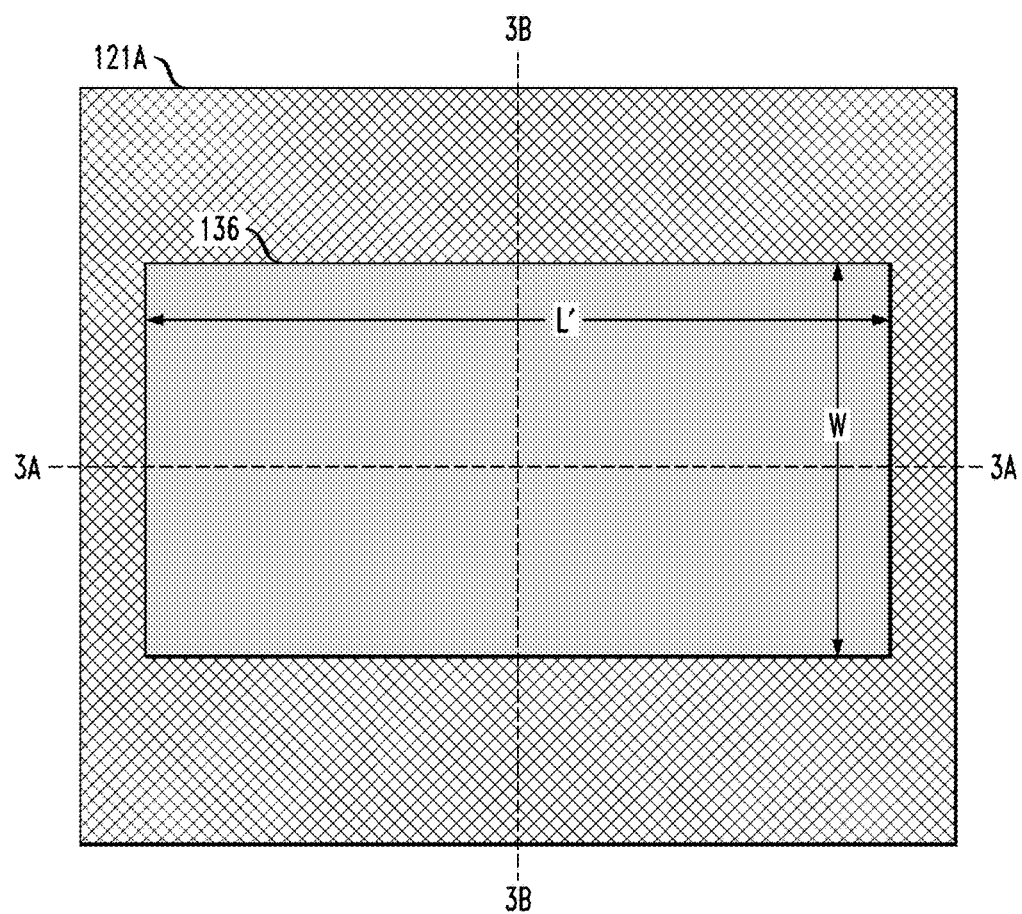

A next phase of the process flow comprises patterning the stack of nanosheet layers 115 to define individual nanosheet stack structures for individual nanosheet FET devices in different regions of the semiconductor substrate 110. For example, FIGS. 3A, 3B, and 3C are schematic views of the semiconductor structure of FIG. 2 after patterning the stack of nanosheet layers 115 to define a nanosheet stack structure 117 comprising a width W and an initial length L'. In particular, FIG. 3A is a cross-sectional schematic side view (X-Z plane) of the semiconductor structure shown in FIG. 2 after etching the stack of nanosheet layers 115 to form the nanosheet stack structure 117 using an etch mask 136. FIG. 3B is a cross-sectional schematic side view of the semiconductor structure shown in FIG. 2 along a Y-Z plane. FIG. 3C is schematic top plan view (X-Y plane) of the semiconductor structure shown in FIGS. 3A and 3B, wherein lines 3A-3A and 3B-3B in FIG. 3C denote cross-sectional views of the semiconductor structure shown in FIGS. 3A and 3B, respectively. The etch mask 136 may comprise, for example, a photoresist mask or a hard mask that is formed by depositing and lithographically patterning a photoresist material or a hard mask material (e.g., SiN). The stack of nanosheet layers 115 can patterned by any suitable patterning techniques, including but not limited to, direct lithography followed by etch, sidewall image transfer, self-aligned double patterning (SADP), self-aligned quadruple pattering (SAQP).

In one embodiment of the invention as shown in FIGS. 3A, 3B, and 3C, the exposed area of the stack of nanosheet layers 115 (not covered by the etch mask 136) is recessed down to the first REO sublayer 121A, thereby leaving the surface of the semiconductor substrate 110 covered by the first REO sublayer 121A. In one embodiment, the stack of nanosheet layers 115 is etched down using one or more sequential dry etch processes, such as a RIE (reactive ion etch) process, with etch chemistries that are suitable to etch the REO layers 121B, 122, 123, and 134, and the semiconductor channel layers 130, selective to the underlying REO sublayer 121A.

The resulting nanosheet stack structure 117 shown in FIGS. 3A, 3B, and 3C comprises an initial length L' (in X direction) and a width W (in Y direction). The width W of the nanosheet stack structure 117 corresponds to the width W of the semiconductor channel layers 130 of the resulting nanosheet FET device. In one exemplary embodiment, the width W of the nanosheet stack structure 117 is in a range of about 10 nm to about 50 nm, and the initial length L' (or final length L) of the nanosheet stack structure 117 is in a range of about 30 nm to about 200 nm.

Figure 4A:
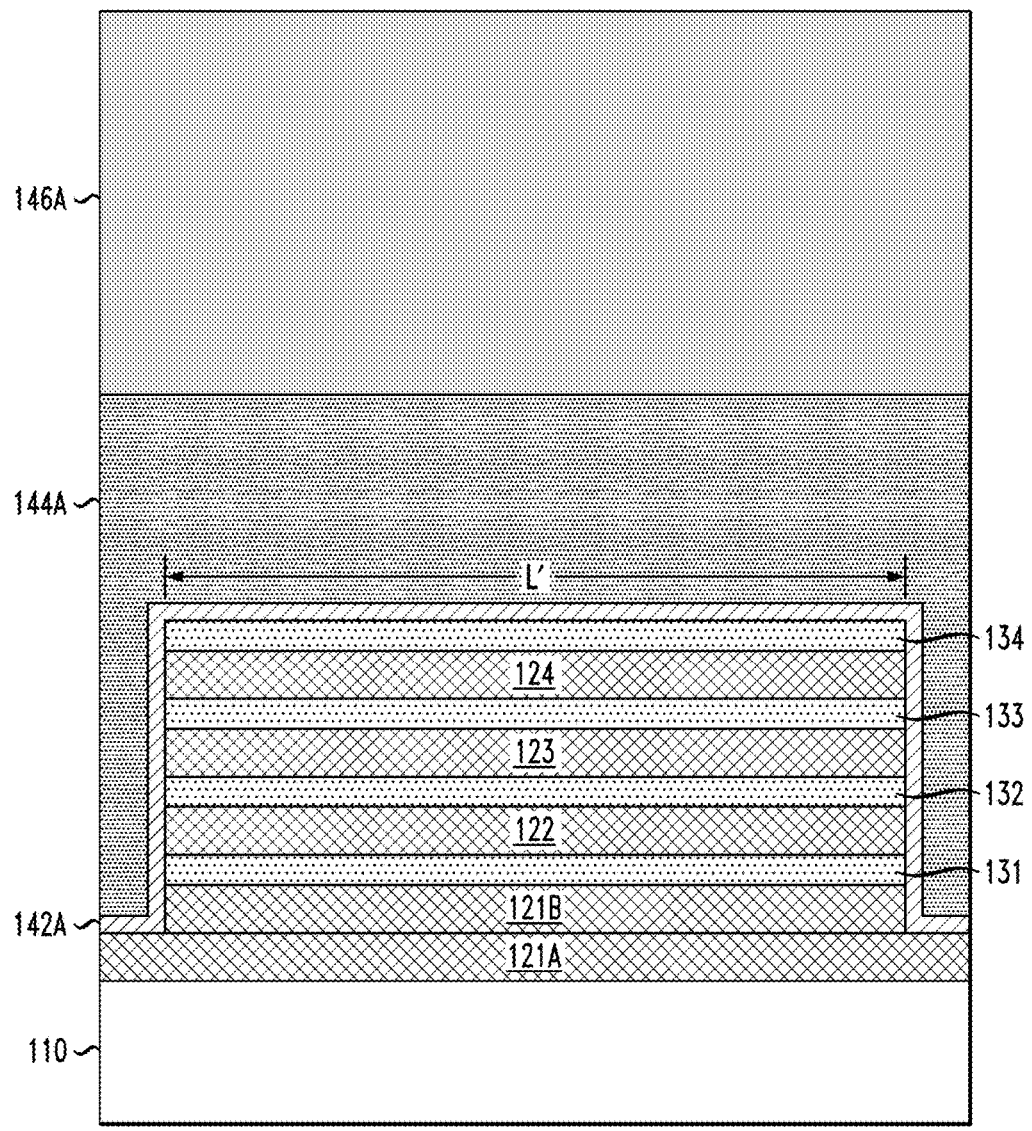
FIGS. 4A and 4B are cross-sectional schematic side views of the semiconductor structure shown in FIGS. 3A and 3B, respectively, after sequentially forming a sacrificial oxide layer, a sacrificial polysilicon layer, and a hard mask layer over the semiconductor structure.
Figure 4B:
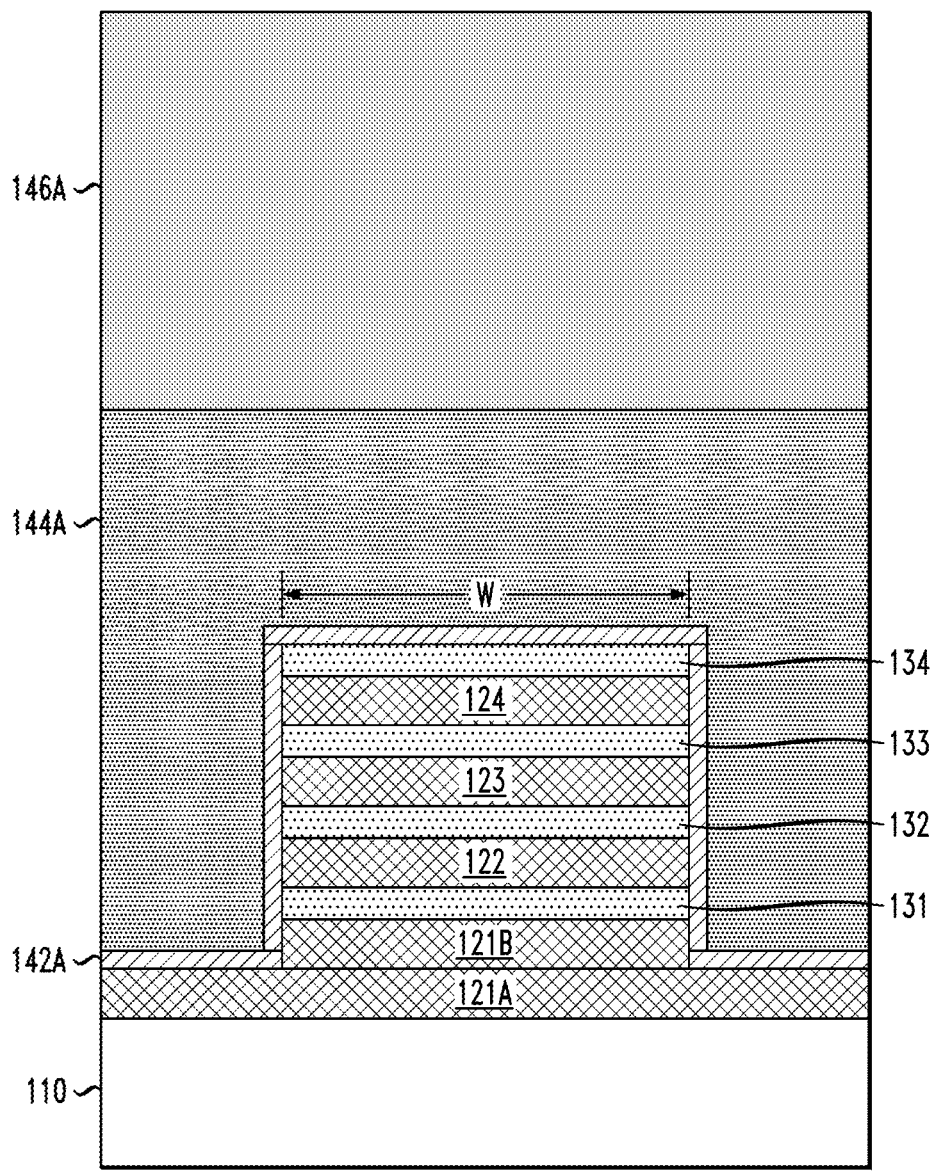

A next phase of the semiconductor process comprises forming dummy gate structure over the nanosheet stack structure 117 using a process flow as schematically illustrated in FIGS. 4A, 4B, 5A, and 5B. For example, FIGS. 4A and 4B are cross-sectional schematic side views of the semiconductor structure shown in FIGS. 3A and 3B, respectively, after removing the etch mask 136, and then sequentially forming a sacrificial oxide layer 142A, a sacrificial polysilicon (or amorphous silicon) layer 144A, and a hard mask layer 146A. In one embodiment, the sacrificial oxide layer 142A is formed by depositing a conformal layer of silicon oxide over the entire surface of the semiconductor structure. The sacrificial polysilicon layer 144A is formed by depositing and planarizing a layer of polysilicon (or alternatively, amorphous silicon) over the entire surface of the semiconductor structure using known techniques. The hard mask layer 146A is formed by depositing a layer of dielectric material or a stack of dielectric materials, including but not limited to silicon oxide, SiN, SiOCN, SiOC, SiBCN over the planarized polysilicon layer 144A using known techniques.

Figure 5A:
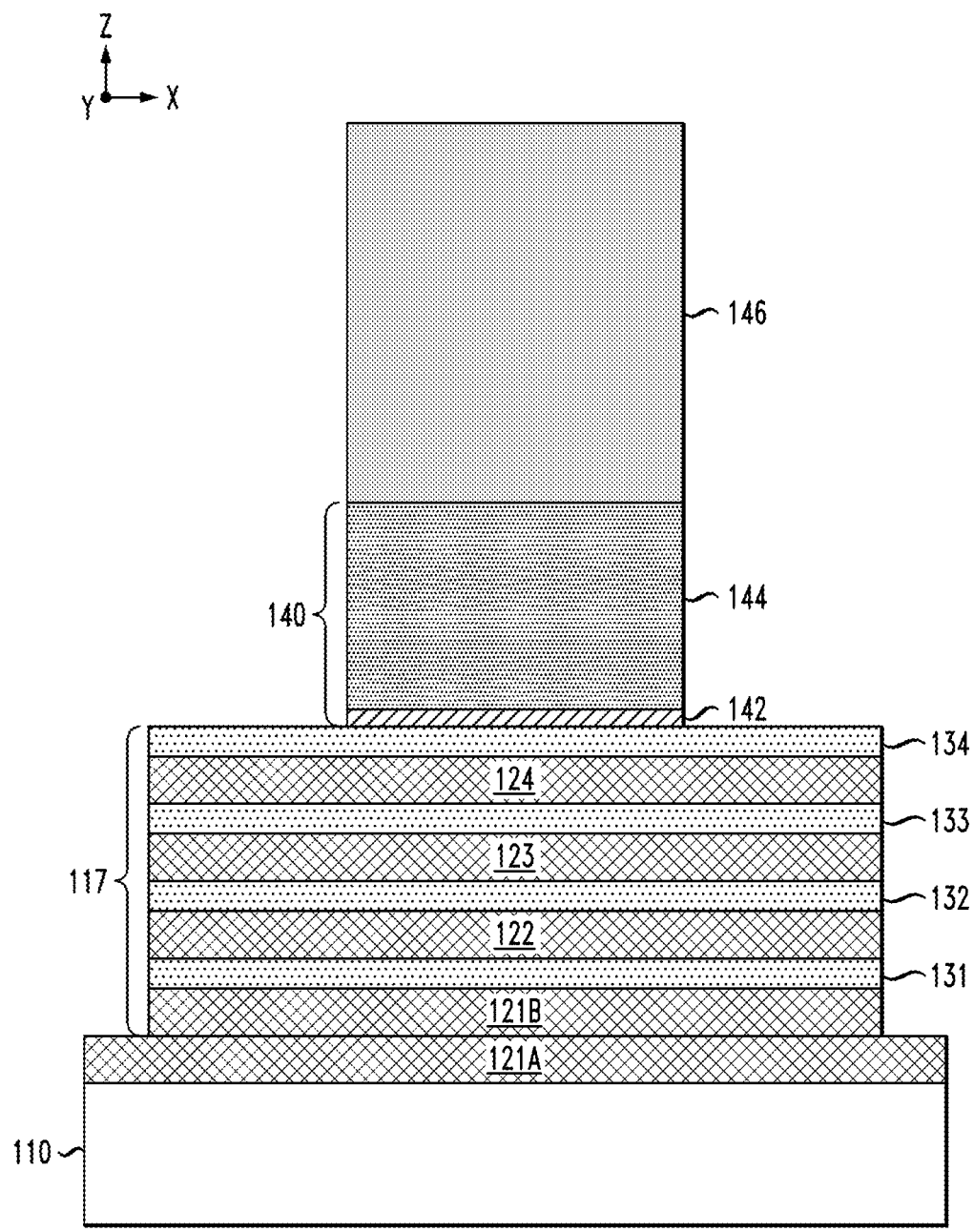
FIGS. 5A and 5B are cross-sectional schematic side views of the semiconductor structure shown in FIGS. 4A and 4B, respectively, after patterning the hard mask layer to form an etch hard mask, and using the etch hard mask to pattern the sacrificial oxide layer and the sacrificial polysilicon layer to form a dummy gate structure.
Figure 5B:
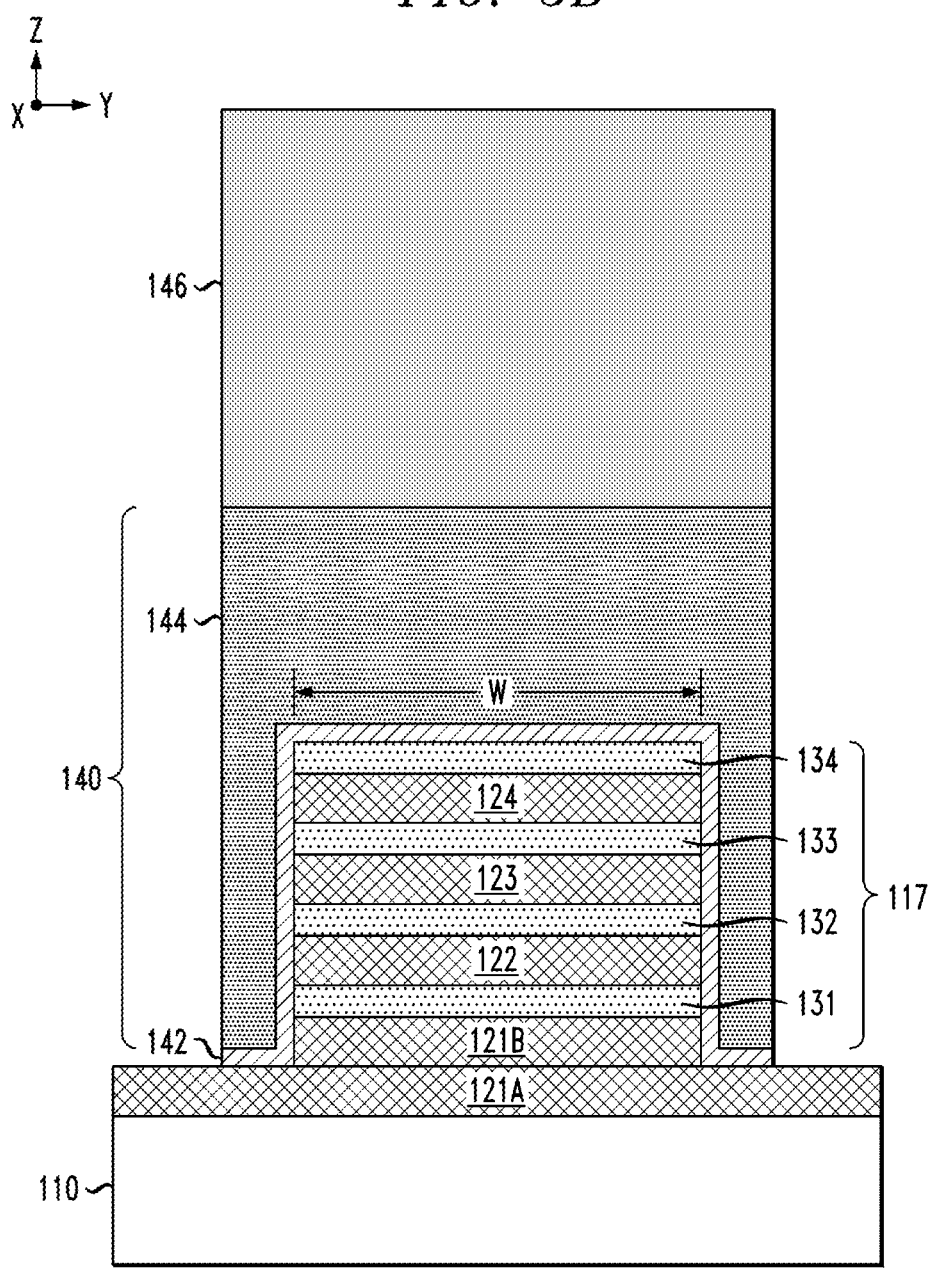

Next, FIGS. 5A and 5B are cross-sectional schematic side views of the semiconductor structure shown in FIGS. 4A and 4B, respectively, after patterning the hard mask layer 146A to form an etch hard mask 146, and using the etch hard mask 146 to pattern the sacrificial oxide layer 142A and the sacrificial polysilicon layer 144A to form a dummy gate structure 140 comprising the dummy polysilicon gate layer 144 and the dummy gate oxide layer 142. The etch hard mask 146 can be formed by lithographically patterning the hard mask layer 146A. The patterning techniques that may be used include, but are not limited to, direct lithography followed by etch, sidewall image transfer, self-aligned double patterning (SADP), self-aligned quadruple pattering (SAQP).

The sacrificial polysilicon layer 144A is etched using a directional dry etch process with an etch chemistry that is suitable to etch the polysilicon material selective to the hard mask 146 and the sacrificial oxide layer 142A. The sacrificial oxide layer 142A is then patterned using an etch process with an etch chemistry that is suitable to etch the sacrificial oxide layer 142A selective to the hard mask 146 and the materials forming the underlying semiconductor channel layer 134 and the REO layer 121. As shown in FIG. 5B, the dummy gate structure 140 is disposed adjacent to, and covers the sidewalls of the nanosheet stack structure 117 which define the width W of the semiconductor channel layers 130 of the nanosheet FET device.

Figure 6A:
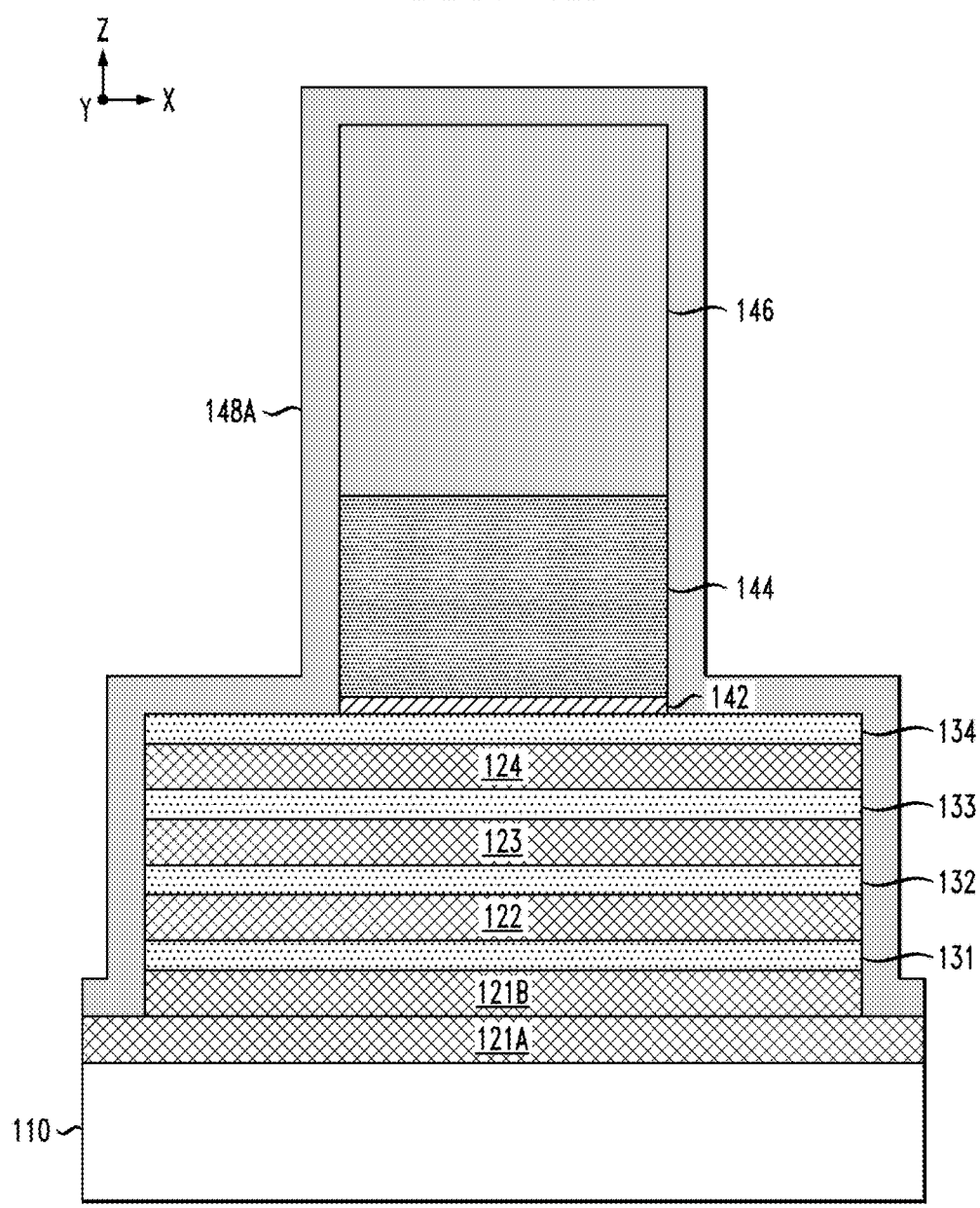

A next phase of the semiconductor process comprises forming a gate insulating spacer on the vertical sidewall surfaces of the dummy gate 140 using a process flow as schematically illustrated in FIGS. 6A, 6B, 7A, and 7B. In particular, FIGS. 6A and 6B are cross-sectional schematic side views of the semiconductor structure shown in FIGS. 5A and 5B, respectively, after depositing a conformal layer of dielectric material 148A over the entire surface of the semiconductor structure. The conformal layer of dielectric material 148A can be formed of SiN, SiBCN, SiCO, SiCON, or any other type of dielectric material that is commonly used to form insulating gate sidewall spacers of FET devices, and deposited using known techniques such as atomic layer deposition (ALD), CVD and PVD.

Figure 7A:
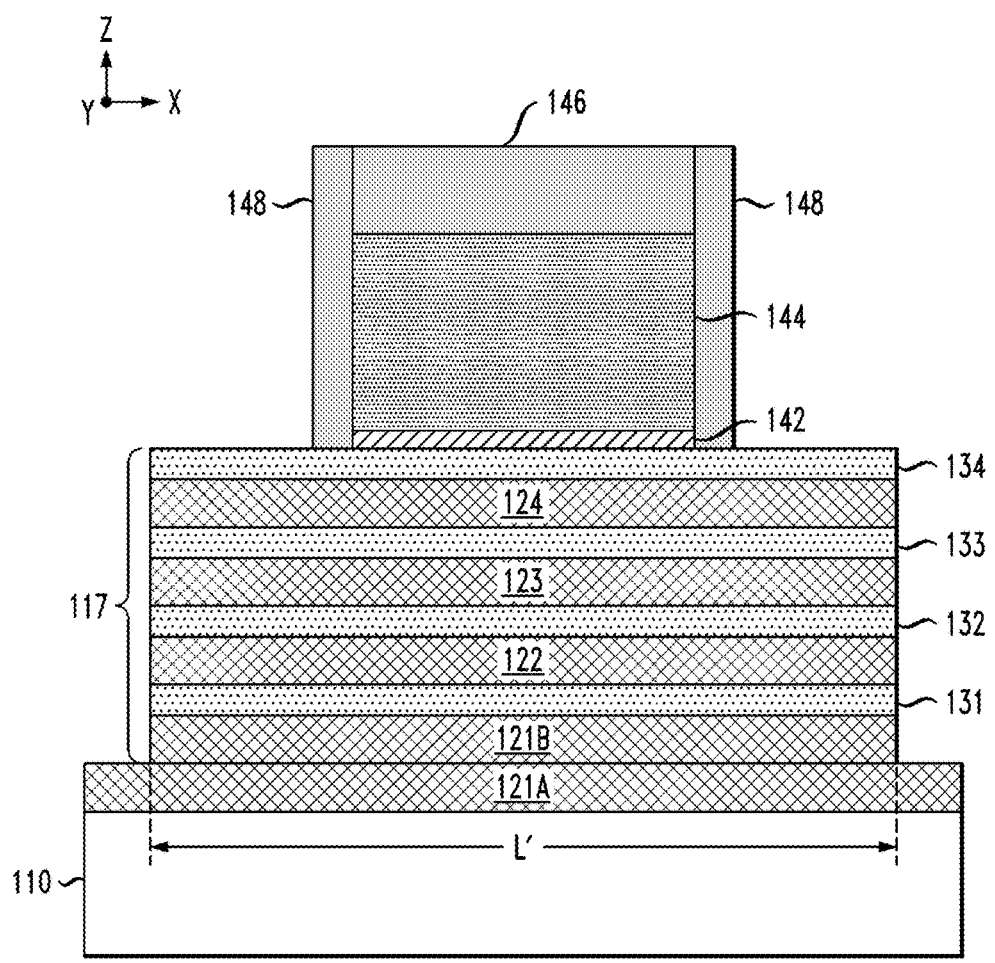
FIGS. 7A and 7B are cross-sectional schematic side views of the semiconductor structure shown in FIGS. 6A and 6B, respectively, after patterning the conformal layer of dielectric material to form a gate insulating spacer on sidewalls of the dummy gate structure.
Figure 7B:
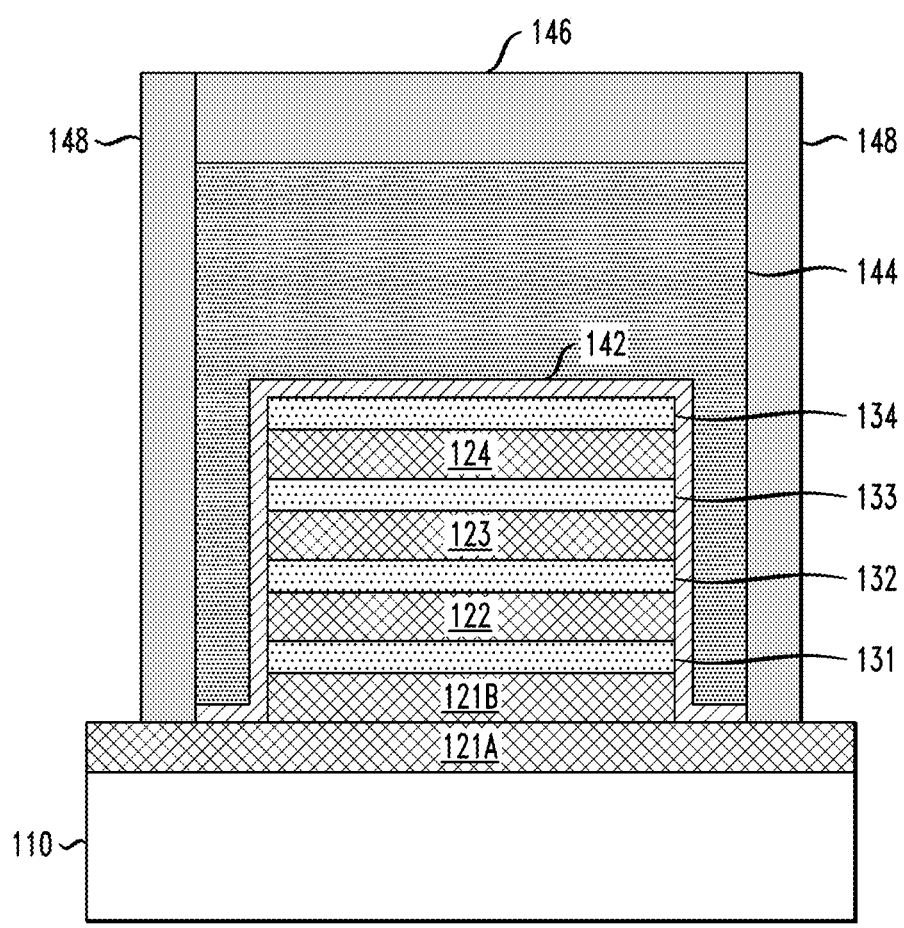

FIGS. 7A and 7B are cross-sectional schematic side views of the semiconductor structure shown in FIGS. 6A and 6B, respectively, after patterning the conformal layer of dielectric material 148A to form the gate insulating spacer 148 on the vertical sidewall surfaces of the dummy gate structure 140. The conformal layer of dielectric material 148A can be etched using an anisotropic dry etch process, such as RIE, to etch down the conformal layer of dielectric material 148A in a vertical direction. This etch process is performed selective to the materials of the semiconductor channel layers 130 and the REO layers 120.

At some point in the etch process, the portions of the conformal layer of dielectric material 148A on the lateral surfaces of the semiconductor structure (e.g., on the upper surface of the hard mask 146, and the exposed upper surfaces of the semiconductor channel layer 134 and REO layer 121A) will be fully etched away, but the anisotropic dry etch process continues to recess the hard mask 146 and pull down the vertical portions of the conformal layer of dielectric material 148A on the sidewalls of the hard mask 146 and on the sidewalls of the nanosheet stack structure 117. The anisotropic dry etch process is terminated when all of the dielectric material 148A is removed from the vertical sidewall surfaces which define the initial length L' of the nanosheet stack structure 117, as shown in FIG. 7A. The hard mask 146 is initially formed with a thickness that is greater than a vertical height of the patterned nanosheet stack structure 117 to ensure that when the dielectric material on the vertical sidewall surfaces of the nanosheet stack structure 117 is fully recessed/pulled down to the exposed surface of the REO layer 121A, a portion of the hard mask layer 146 (with reduced thickness) remains on top of the dummy gate structure 140, with the insulating sidewall spacer 148 fully covering the vertical sidewall surfaces of the dummy gate structure 140, as shown in FIGS. 7A and 7B.

A next step in the fabrication process flow includes patterning the nanosheet stack structure 117 using a directional RIE process to etch down exposed portions of the nanosheet stack structure 117 which extend past the gate insulating spacer 148 on the sidewalls of the dummy gate structure 140. In particular, FIG. 8 is a cross-sectional schematic side view of the semiconductor structure shown in FIG. 7A after recessing the nanosheet stack structure 117 down to the REO layer 121A. With this etch process, the REO layer 121A is not etched to ensure that the semiconductor substrate 110 remains covered by the REO layer 121A. As a result of the etch process shown in FIG. 8, the initial length L' of the nanosheet stack structure 117 is reduced to a length L, which defines a length (in the X-direction) of the semiconductor channel layers 130 of the resulting nanosheet FET device. The width W (in the Y-direction) of the nanosheet stack structure 117 is maintained since the sidewall surfaces of the nanosheet stack structure 117 which define the width W are covered by the dummy gate structure 140 and the gate insulating spacer 148 (see FIG. 7B).

Figure 9:
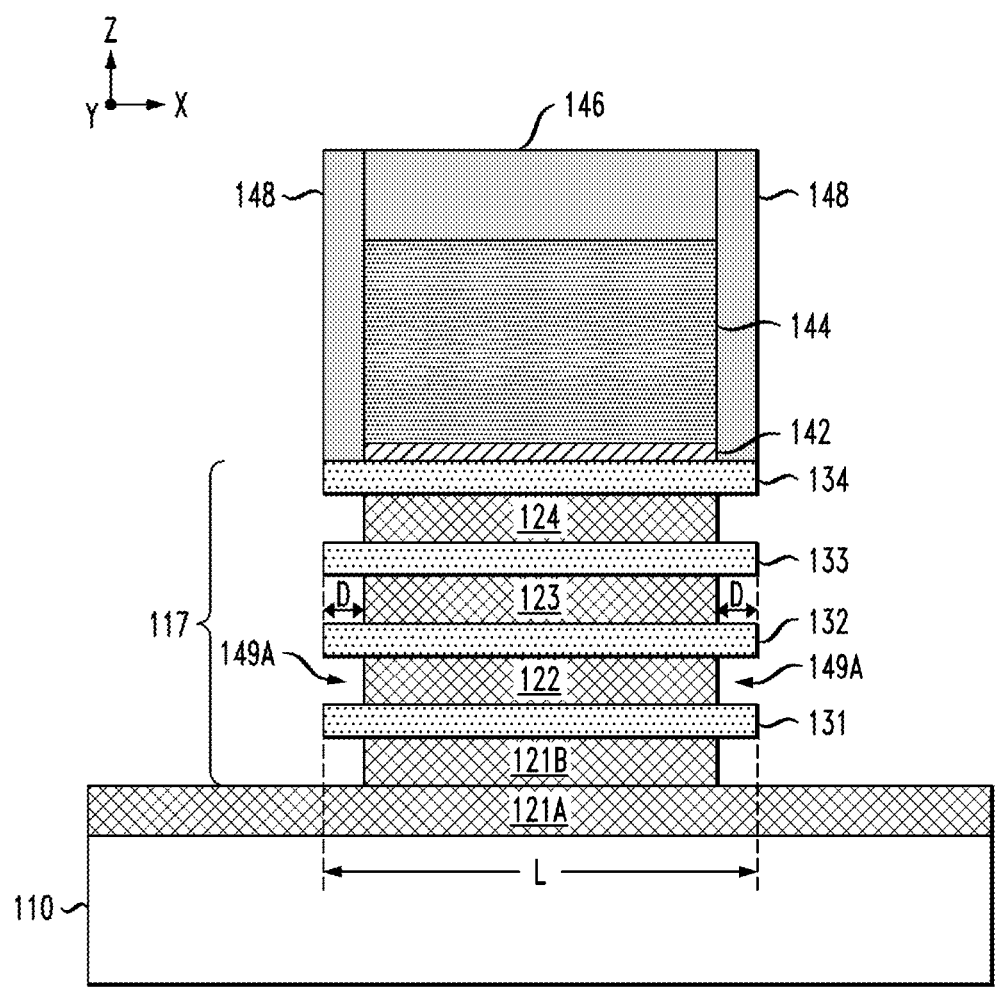
Figure 10:
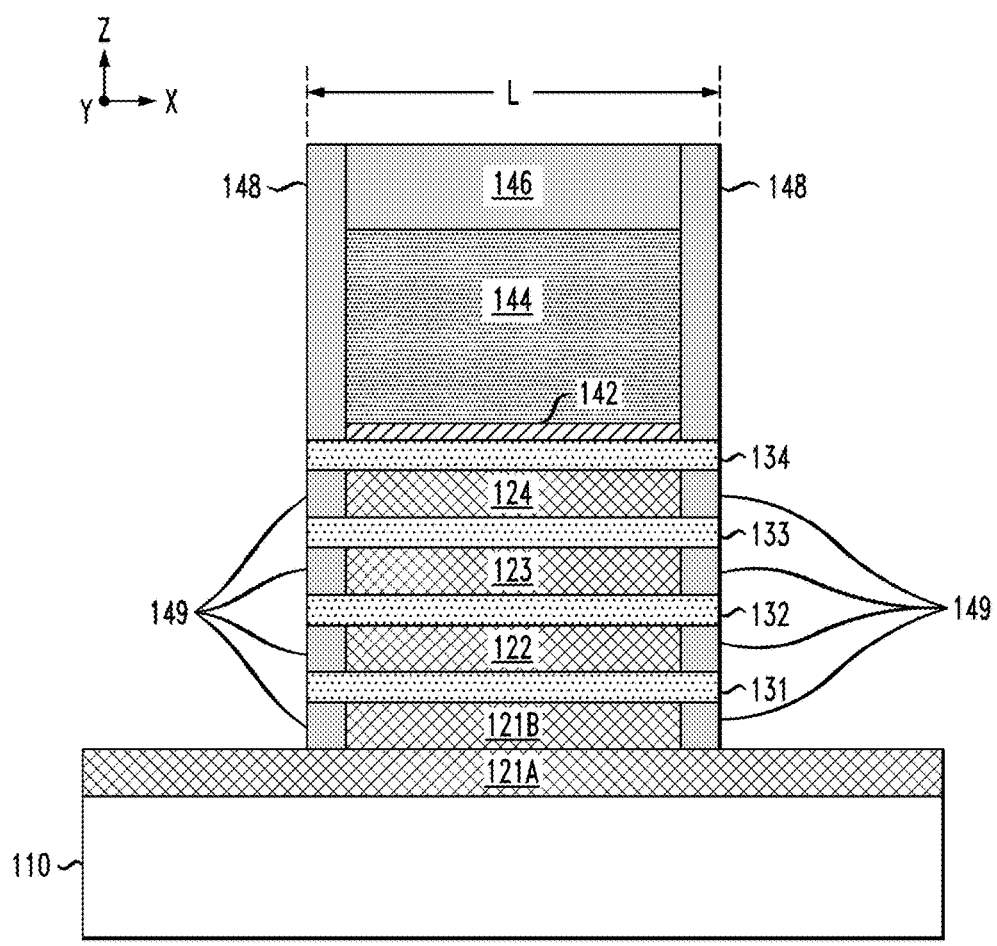

A next phase of the fabrication process comprises forming gate insulating spacers that are embedded in the vertical sidewall surfaces that define the length L of the nanosheet stack structure 117, using a process flow as schematically illustrated in FIGS. 9 and 10. In particular, FIG. 9 is a cross-sectional schematic side view of the semiconductor structure shown in FIG. 8 after laterally recessing the exposed sidewall surfaces of the sacrificial REO layers 121B, 122, 123 and 124 of the nanosheet stack structure 117 to form recesses 149A in the vertical sidewalls (which define the length L) of the nanosheet stack structure 117. As shown in FIG. 9, the exposed sidewall surfaces of the sacrificial REO layers 121B, 122, 123 and 124 are recessed to a depth, D (in the X-direction). The amount of lateral recess (depth D) is controlled through a timed etch. In one embodiment, the depth D is substantially equal to the thickness of the gate insulating spacers 148 on the sidewalls of the dummy gate structure 140.

In one embodiment of the invention, the lateral etch process can be performed using an isotropic wet etch process with an etch solution that is suitable to etch the material of the sacrificial REO layers 121B, 122, 123 and 124 selective to the materials of the REO layer 121A and the semiconductor channel layers 131, 132, 133, and 134. In another embodiment, an isotropic dry plasma etch process can be performed to laterally etch the exposed sidewall surfaces of the sacrificial REO layers 121B, 122, 123 and 124 selective to the materials of the REO layer 121A and the semiconductor channel layers 131, 132, 133, and 134.

Next, FIG. 10 is a cross-sectional schematic side view of the semiconductor structure shown in FIG. 9 after filling the recesses 149A in the vertical sidewalls of the nanosheet stack structure 117 with dielectric material to form the embedded gate insulating spacers 149. In one embodiment, the embedded gate insulating spacers 149 are formed by depositing a conformal layer of dielectric material over the semiconductor structure until the recesses 149A are filled with dielectric material, followed by an etch back to remove excess dielectric material on the vertical sidewalls of the nanosheet stack structure 117 and on the surface of the REO layer 121A, resulting in the semiconductor structure shown in FIG. 10.

In one embodiment, the embedded gate insulating spacers 149 are formed of the same dielectric material used to form the gate insulating spacer 148 on the sidewalls of the dummy gate structure 140. For example, the embedded gate insulating spacers 149 can be formed of SiN, SiBCN, SiCO, SiBCN, SiCON, or any other type of dielectric material (e.g., a low-k dielectric material having a k of less than 5) which is commonly used to form insulating gate sidewall spacers of FET devices. In one embodiment, the dielectric material is conformally deposited using a highly conformal deposition process, such as ALD, to ensure that the recesses 149A are sufficiently filled with dielectric material. Other deposition methods such as CVD and PVD can be utilized to deposit a highly conformal layer of dielectric material to fill the recesses 149A. The conformal layer of dielectric material can be etched back using a wet etch process to remove the excess dielectric material on the sidewalls of the nanosheet stack structure 117, while leaving the dielectric material in the recesses 149A to form the embedded gate insulating spacers 149. The wet etch process may include, but is not limited to, buffered hydrofluoric acid (BHF), diluted hydrofluoric acid (DHF), hydrofluoric nitric acid (HNA), phosphoric acid, HF diluted by ethylene glycol (HFEG), hydrochloric acid (HCl), or any combination thereof.

Figure 11:
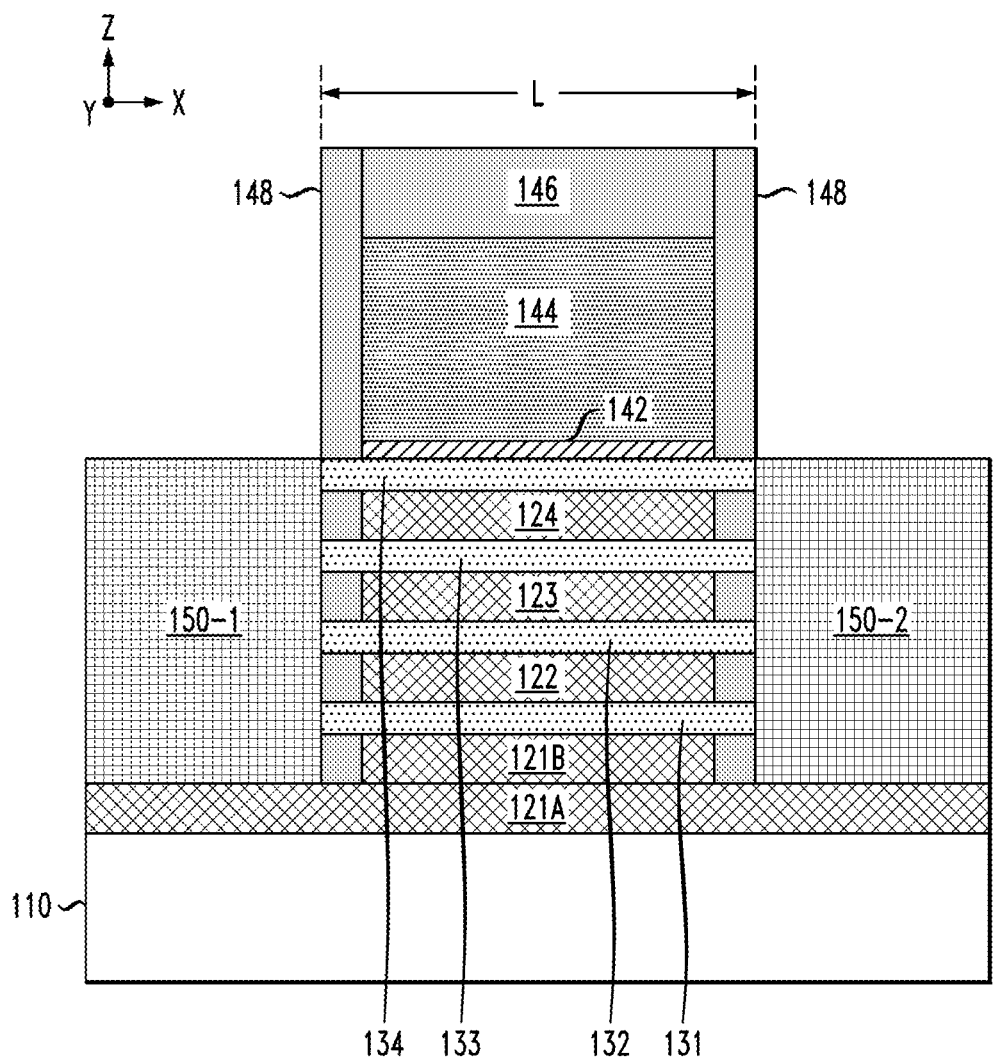

Next, FIG. 11 is a cross-sectional schematic side view of the semiconductor structure shown in FIG. 10 after forming the source/drain regions 150-1 and 150-2 adjacent to the nanosheet stack structure 117 in contact with the semiconductor channel layers 130. In one embodiment, the source/drain regions 150-1 and 150-2 comprise epitaxial semiconductor material (e.g., SiGe) that is epitaxially grown on the exposed sidewall surfaces of the semiconductor channel layers 131, 132, 133, and 134 of the nanosheet stack structure 117 using known techniques. In another embodiment, the source/drain regions 150-1 and 150-2 are formed by epitaxially growing epitaxial semiconductor material on the exposed sidewall surfaces of the semiconductor channel layers 131, 132, 133, and 134 of the nanosheet stack structure 117 and on the exposed surface of the portion of the REO layer 121A that extends past the gate insulating spacers 148 and 149.

The epitaxial source/drain regions 150-1 and 150-2 can be epitaxially grown using known methods such as CVD, MOCVD (metal-organic CVD), LPCVD (Low Pressure CVD), MBE (molecular beam epitaxy), VPE (vapor-phase epitaxy), or other known epitaxial growth techniques which are suitable for the given process flow. The type of epitaxial semiconductor material that is used to form the source/drain regions 150-1 and 150-2 will vary depending on various factors including, but not limited to, the type of material of the semiconductor channel layers 131, 132, 133, and 134, the device type (e.g., n-type or p-type) of the nanosheet FET device, etc.

The epitaxial growth of the semiconductor material on the exposed surfaces of the semiconductor channel layers 131, 132, 133, and 134 and the REO layer 121A merges to form the source/drain regions 150-1 and 150-2, as shown in FIG. 11. Following the epitaxial growth process, the epitaxial material can be patterned using known techniques to remove excess portions of the epitaxial material that is grown on the exposed surface of the REO layer 121A in the field regions, and to separate source/drain regions of adjacent nanosheet FET devices, as needed, to achieve a target circuit layout.

In one embodiment, the process conditions of the epitaxy process can be adjusted such that a growth rate of the epitaxial semiconductor material on the exposed surface of the REO layer 121A is significantly lower than the growth rate of the epitaxial material on the exposed sidewall surfaces of the semiconductor channel layers 131, 132, 133, and 134, thereby minimizing the amount of excess epitaxial material that needs to be removed in the field regions of the circuit layout. In another embodiment, the process conditions of the epitaxy process can be adjusted such epitaxial semiconductor material only grows on the exposed sidewall surfaces of the semiconductor channel layers 131, 132, 133, and 134, and not on the exposed surface of the REO layer 121A, whereby the source/drain regions 150-1 and 150-2 are formed by merging the growth of the epitaxial semiconductor material on the exposed sidewall surfaces of the semiconductor channel layers 131, 132, 133, and 134.

Furthermore, in one embodiment, the source/drain regions 150-1 and 150-2 are doped using known techniques. For example, the source/drain regions 150-1 and 150-2 may be in-situ doped during epitaxial growth by adding a dopant gas to the source deposition gas (i.e., the Si-containing gas). Exemplary dopant gases may include a boron-containing gas such as $BH_3$ for pFETs or a phosphorus or arsenic containing gas such as $PH_3$ or $AsH_3$ for nFETs, wherein the concentration of impurity in the gas phase determines its concentration in the epitaxially grown semiconductor material. Alternatively, the source/drain regions 150-1 and 150-2 can be doped ex-situ using ion implantation techniques.

Following formation of the epitaxial source/drain regions, the process flow continues with covering the source/drain regions with insulating material and commencing a replacement metal gate (RMG) process. For example, FIG. 12 is a cross-sectional schematic side view of the semiconductor structure shown in FIG. 11 after forming the insulating 160 layer and removing the hard mask 146 to expose the dummy gate structure 140. More specifically, in one embodiment, the semiconductor structure in FIG. 12 is formed by depositing a layer of dielectric/insulating material over the semiconductor structure of FIG. 11, and planarizing the layer of dielectric/insulating material to form the insulating layer 160 and to expose the upper portion of the dummy poly gate layer 144 of the dummy gate structure 140.

The insulating layer 160 may comprise any suitable insulating/dielectric material that is commonly utilized in FEOL process technologies including, but not limited to, silicon oxide, silicon nitride, SiCOH, SiCH, SiCNH, or other types of silicon-based low-k dielectrics (e.g., k less than about 4.0), porous dielectrics, or known ULK (ultra-low-k) dielectric materials (with k less than about 2.5). The dielectric/insulating material of the insulating layer 160 may be deposited using known deposition techniques, such as, for example, ALD, CVD, PECVD, PVD, or spin-on deposition. In one embodiment, the layer of dielectric/insulating material is planarized using a standard planarization process such as CMP, wherein the surface of the semiconductor structure is planarized to expose the dummy poly gate layer 144 of the dummy gate structure 140.

Figure 13A:
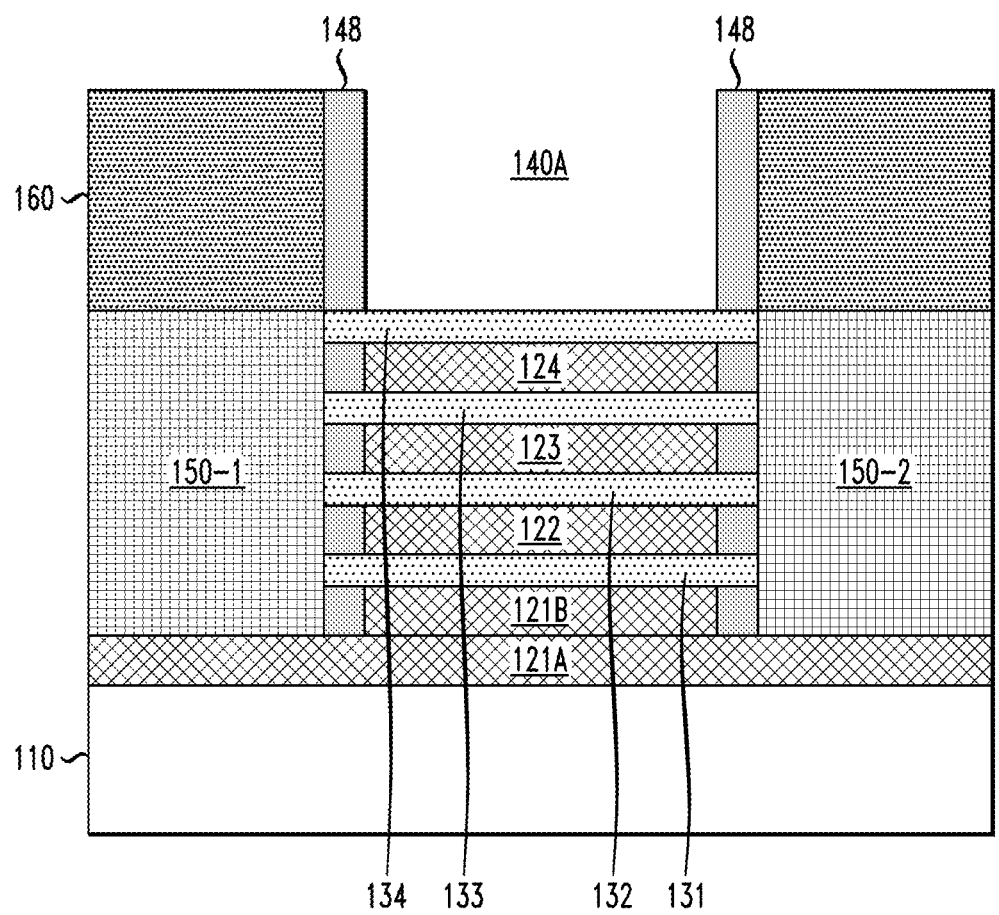
FIGS. 13A, 13B, and 13C are schematic views of the semiconductor structure shown in FIG. 12 after removing the dummy gate structure to form a gate recess region.
Figure 13B:
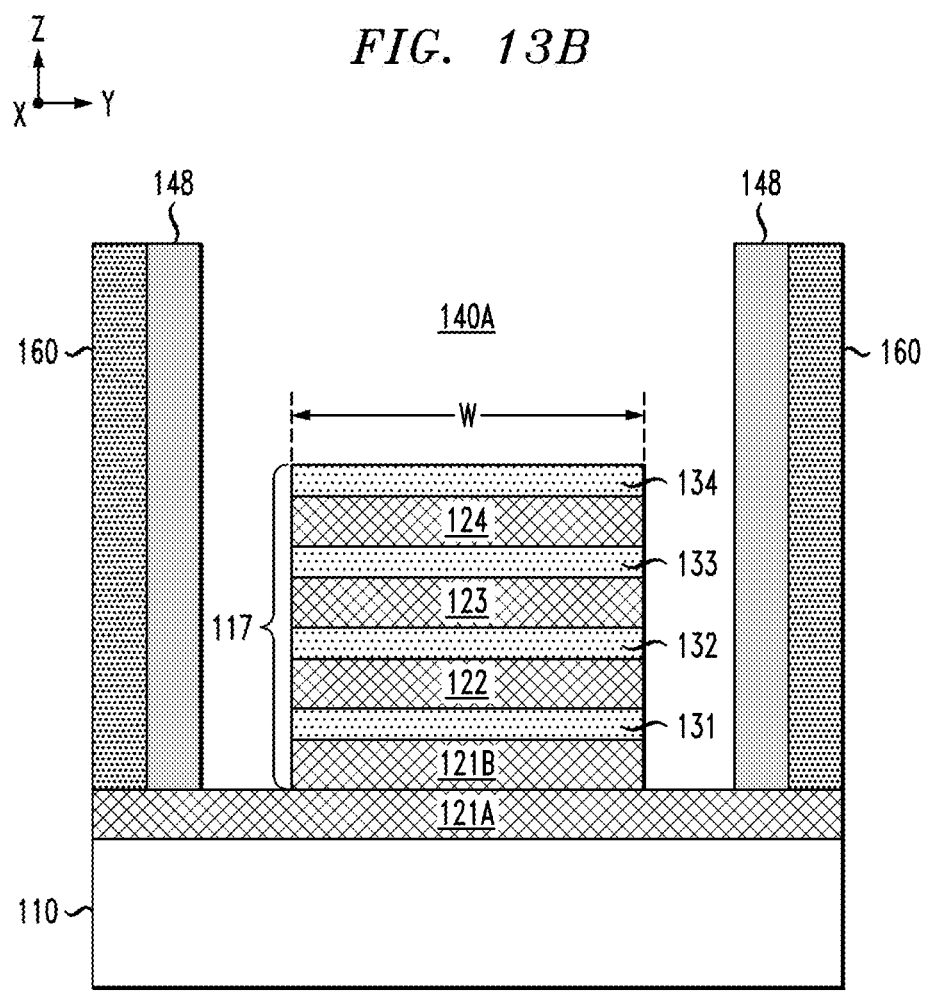
Figure 13C:
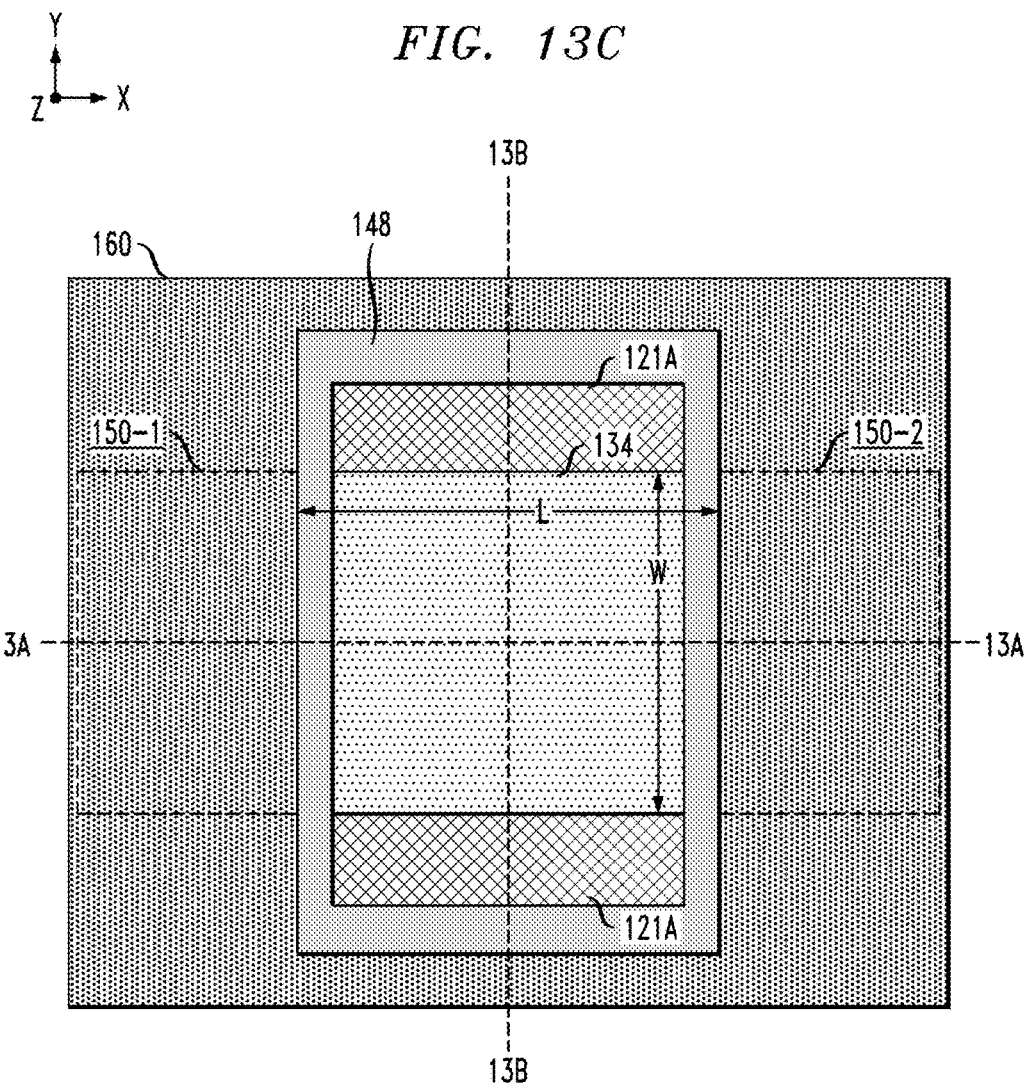

Following planarization of the insulating layer 160, a sequence of etching steps is performed to remove the sacrificial material (dummy poly gate layer 144 and dummy oxide layers 142) of the dummy gate structure 140. For example, FIGS. 13A, 13B, and 13C are schematic views of the semiconductor structure shown in FIG. 12 after removing the dummy gate structure 140 to form a gate recess region 140A. In particular, FIG. 13A is a cross-sectional schematic side view (X-Z plane) of the semiconductor structure shown in FIG. 12 after removing the dummy gate structure 140 to form the gate recess region 140A. FIG. 13B is a cross-sectional schematic side view of the semiconductor structure shown in FIG. 13A along a Y-Z plane. FIG. 13C is schematic top plan view (X-Y plane) of the semiconductor structure shown in FIGS. 13A and 13B, wherein lines 13A-13A and 13B-13B in FIG. 13C denote cross-sectional views of the semiconductor structure shown in FIGS. 13A and 13B, respectively. As shown in FIGS. 13B and 13C, the gate recess region 140A extends down between the sidewall spacers 148 and the vertical sidewalls (which define the width W) of the nanosheet stack structure 117, thereby exposing a portion of the surface of the underlying REO layer 121A. As shown in FIG. 13B, the gate recess region 140A exposes the sidewall surfaces of the REO layers 121B, 122, 123, and 124 on the vertical sidewalls that define the width W of the nanosheet stack structure 117.

In one embodiment, the dummy gate structure 140 is removed using an etch process which comprises a first etch process to etch away the dummy poly gate layer 144 selective to the underlying dummy oxide layer 142 and the dielectric materials of the insulating layer 160 and the spacer 148, followed by a second etch process to remove the underlying dummy oxide layer 142 selective to the materials of the insulating layer 160, the spacer 148, and the nanosheet stack 117.

For example, the dummy poly gate layer 144 can be removed using a selective dry etch or wet etch process with suitable etch chemistries, including ammonium hydroxide ($NH_4OH$) or tetramethylammonium hydroxide (TMAH). As noted above, the etching of the dummy poly gate layer 144 is selective to, e.g., dummy gate oxide layer 142, to thereby protect the semiconductor channel layers 130 of the nanosheet stack 117 from being etched during the poly etch process. After the polysilicon material is removed, an oxide etch process is performed to etch away the dummy gate oxide layer 142 selective to, e.g., the semiconductor channel layers 130 of the nanosheet stack 117. In this manner, the sacrificial materials (e.g., dummy polysilicon and oxide layers) of the dummy gate structure 140 can be etched away without damaging the semiconductor channel layers 131, 132, 133, and 134 of the nanosheet stack structure 117.

Following removal of the dummy gate structure 140, the replacement metal gate process continues by etching away the sacrificial REO layers 121B, 122, 123, and 124 to release the semiconductor channel layers 130. For example, FIGS. 14A and 14B are cross-sectional schematic side views of the semiconductor structure shown in FIGS. 13A and 13B, respectively, after etching the sacrificial REO layers 121B, 122, 123, and 124 of the nanosheet stack 117 to release the semiconductor channel layers 130 of the nanosheet stack 117, thereby allowing the gate recess region 140A to extend into spaces between the semiconductor channel layers 130.

The sacrificial REO layers 121B, 122, 123, and 124 are etched using a wet etch process, for example, which serves to etch away the sacrificial REO layers 121B, 122, 123, and 124 selective to the REO layer 121A and the semiconductor channel layers 130 (as well as the materials of, e.g., the spacer 148 and the insulating layer 160). For example, the sacrificial REO layers 121B, 122, 123, and 124 may be etched using an aqueous solution containing mixture of hydrofluoric acid with ammonium fluoride. With this etch process, the exposed surface of the REO layer 121A is not etched (or very slightly etched) so that a relatively thick layer of REO material of the REO layer 121A will remain between the lower portion of the gate recess region 140A and the semiconductor substrate 110.

Next, the replacement metal gate process continues with a process flow to form the metal gate structure 170 shown in FIGS. 1A and 1B. As an initial step of this process, FIGS. 15A and 15B are cross-sectional schematic side views of the semiconductor structure shown in FIGS. 14A and 14B, respectively, after depositing conformal layers of gate dielectric material and work function metal material to form the high-k metal gate stack structures 172 on the exposed surfaces of the semiconductor channel layers 130 in the gate recess region 140A.

Figure 14A:
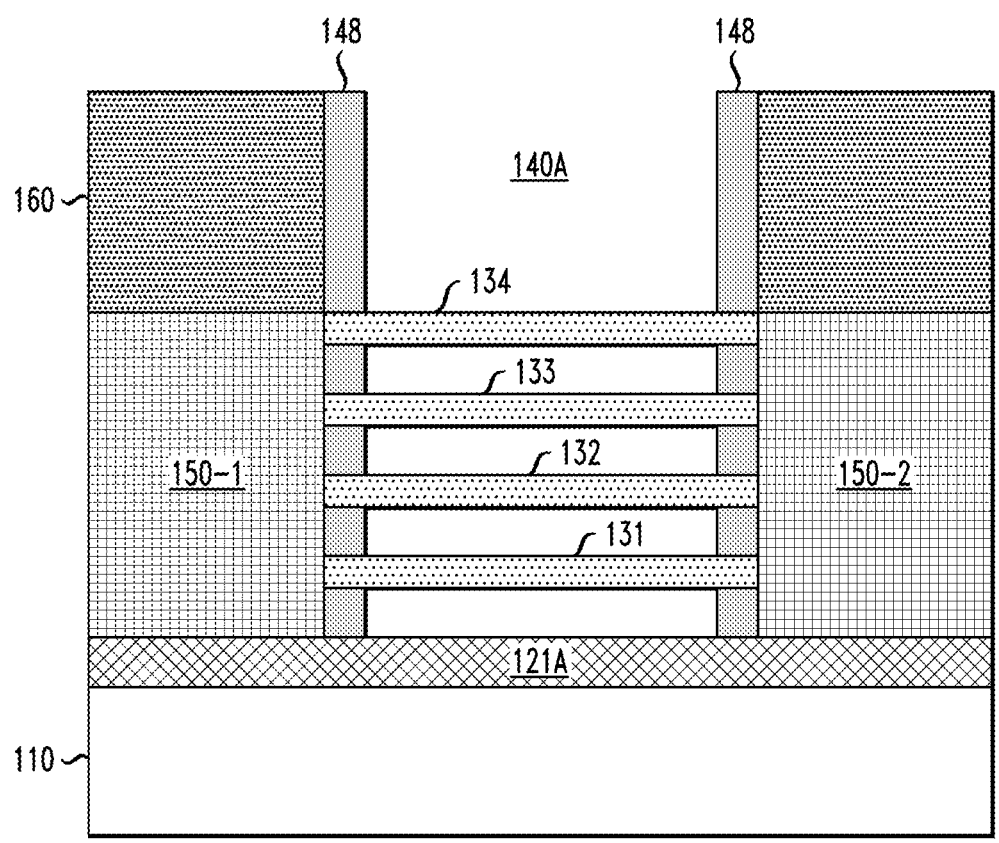
FIGS. 14A and 14B are cross-sectional schematic side views of the semiconductor structure shown in FIGS. 13A and 13B, respectively, after etching the sacrificial REO layers of the nanosheet stack to release the semiconductor channel layers of the nanosheet stack.
Figure 14B:
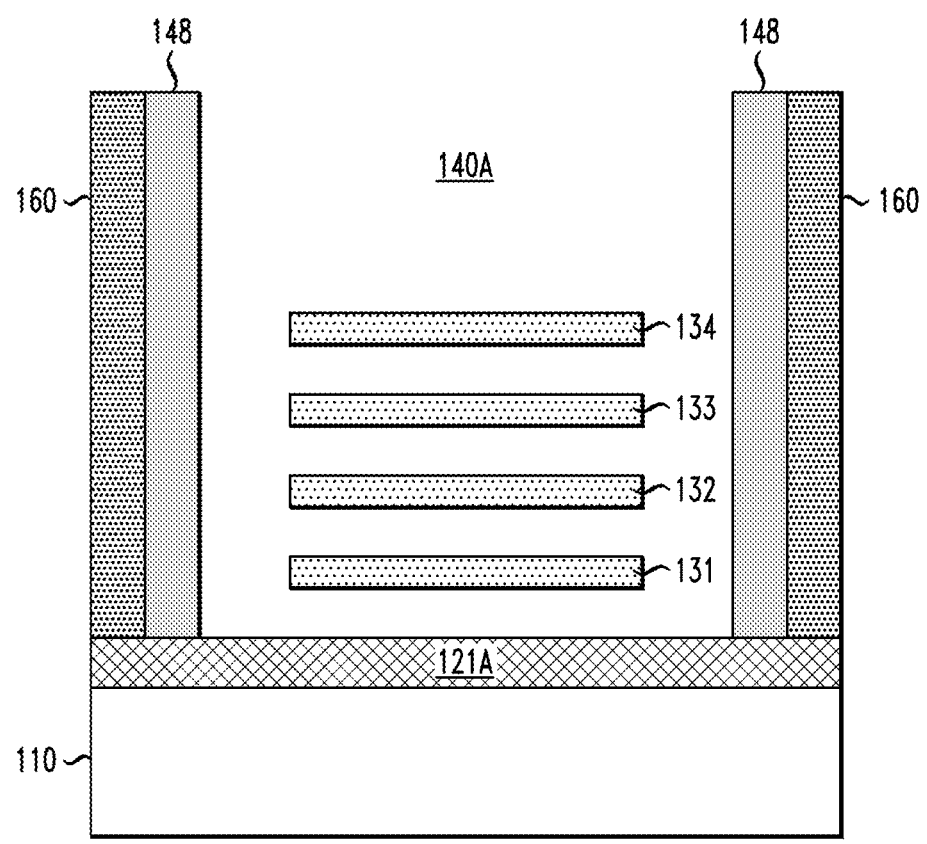

In one embodiment, the layer of gate dielectric material is formed by depositing one or more conformal layers of gate dielectric material over the surface of the semiconductor structure shown in FIGS. 14A and 14B. The gate dielectric material may comprise, e.g., nitride, oxynitride, or oxide or a high-k dielectric material having a dielectric constant of about 3.9 or greater. For example, the conformal gate dielectric material can include silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum. In one embodiment of the invention, the conformal layer of gate dielectric material is formed with a thickness in a range of about 0.5 nm to about 2.5 nm, which will vary depending on the target application. The conformal layer of gate dielectric material is deposited using known methods such as ALD, for example, which allows for high conformality of the gate dielectric material The conformal layer of work function metal may be formed of one or more types of metallic materials, including, but not limited to, TiN, TaN, TiAlC, Zr, W, Hf, Ti, Al, Ru, Pa, TiAl, ZrAl, WAl, TaAl, HfAl, TiAlC, TaC, TiC, TaMgC, or other work function metals or alloys that are commonly used to obtain target work functions which are suitable for the type (e.g., n-type or p-type) of nanosheet FET devices that are to be formed. The conformal layer of work function metal is deposited using known methods such as ALD, CVD, etc. In one embodiment, the conformal layer of work function metal is formed with a thickness in a range of about 2 nm to about 5 nm.

Figure 15A:
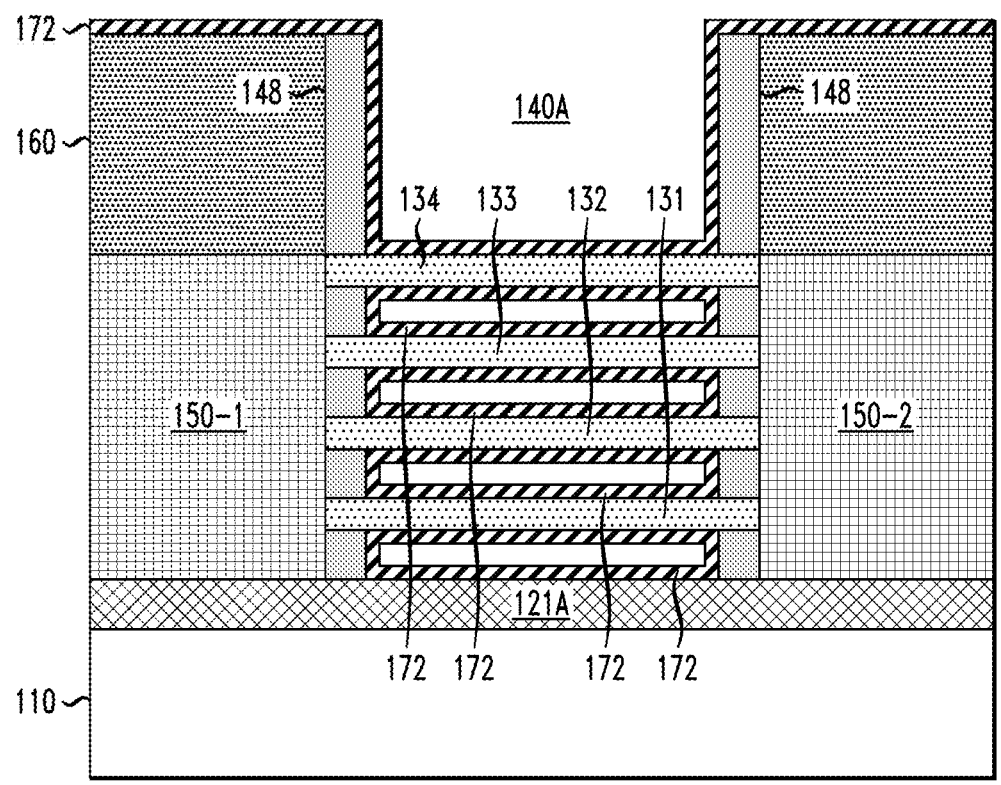

FIGS. 15A and 15B illustrate an exemplary embodiment in which empty spaces remain between the semiconductor channel layers 131, 132, 133 and 134, and between the semiconductor channel layer 131 and the REO layer 121A, after formation of the high-k metal gate stack structures 172. However, as noted above, in another embodiment, the high-k metal gate stack structures 172 are formed with a thickness that completely fills the spaces between the semiconductor channel layers 131, 132, 133 and 134, and between the semiconductor channel layer 131 and the REO layer 121A. In this embodiment, the metallic material of the WFM layer could be deposited on top of the thin gate dielectric layer with a thickness that is sufficient to at least fill the spaces between the between the semiconductor channel layers 131, 132, 133 and 134, and between the semiconductor channel layer 131 and the REO layer 121A, as well as fill the vertical spaces between the ends of the semiconductor channel layers 131, 132, 133 and 134 and the vertical gate insulating spacer 148 (FIG. 15B). In another embodiment, the metallic material of the WFM layer can be deposited to completely fill the gate recess region 140A, in which case the WFM layer also serves as the gate electrode layer 174.

Figure 16A:
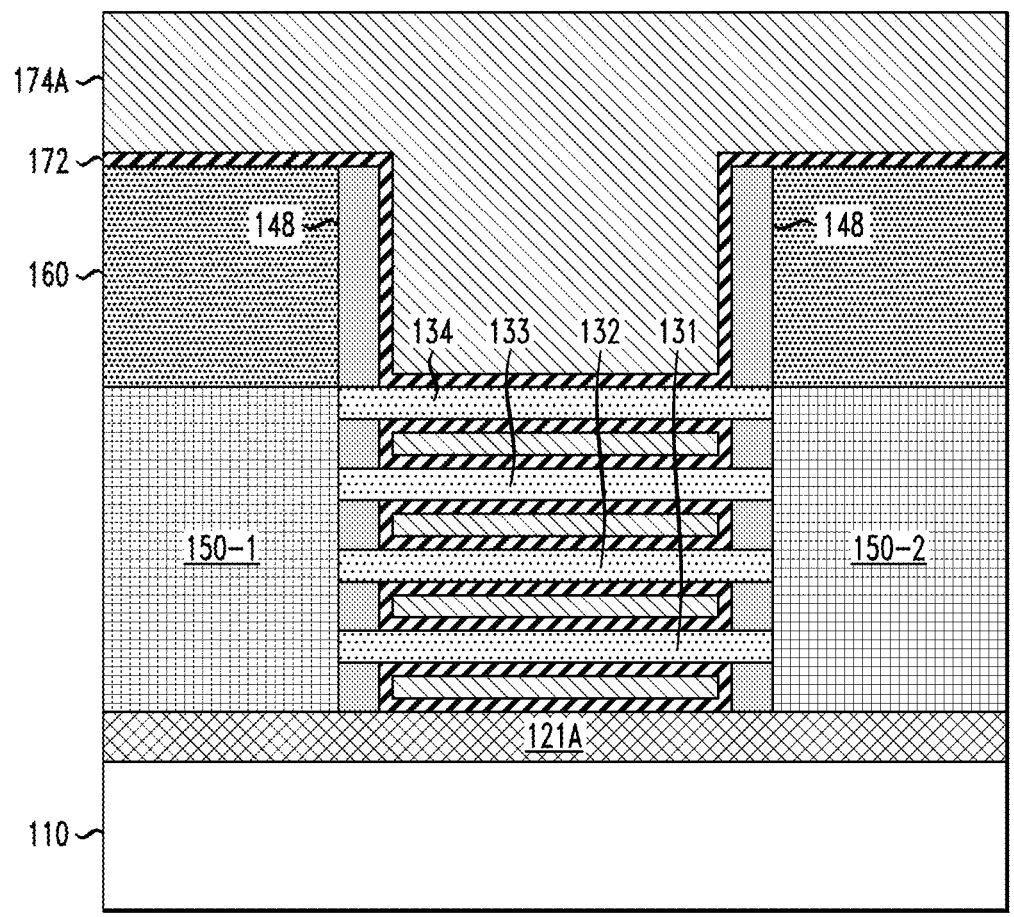
FIGS. 16A and 16B are cross-sectional schematic side views of the semiconductor structure shown in FIGS. 15A and 15B, respectively, after depositing a layer of metallic material to fill the gate recess region with metallic material to form a metal gate electrode of a metal gate structure.
Figure 16B:
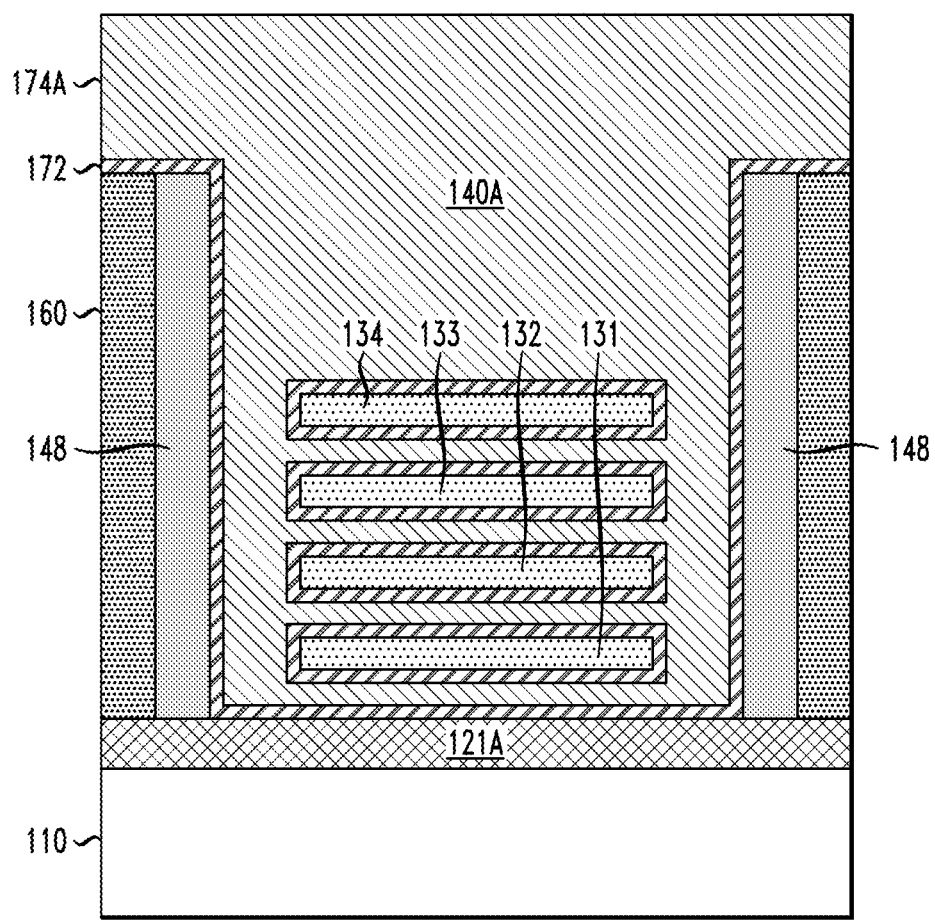

Next, FIGS. 16A and 16B are cross-sectional schematic side views of the semiconductor structure shown in FIGS. 15A and 15B, respectively, after depositing a layer of conductive material 174A to fill the gate recess region 140A with material that forms the metal gate electrode 174 of the metal gate structure 170. The layer of metallic material 174A is formed with a conductive material including, but not limited to, doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material 174A may further comprise dopants that are incorporated during or after deposition.

As shown in FIGS. 16A and 16B, the conductive material 174A fills the gate recess region 140A including the spaces between the semiconductor channel layers 131, 132, 133, and 134, thereby encapsulating the semiconductor channel layers 131, 132, 133, and 134 within the gate electrode layer 174. The conductive material 174A is deposited using a suitable deposition process, for example, CVD, PECVD, PVD, plating, thermal or e-beam evaporation, sputtering, etc. As noted above, in another embodiment, the conductive material 174A that forms the gate electrode layer 174 can serve as a WFM layer.

Figure 17:
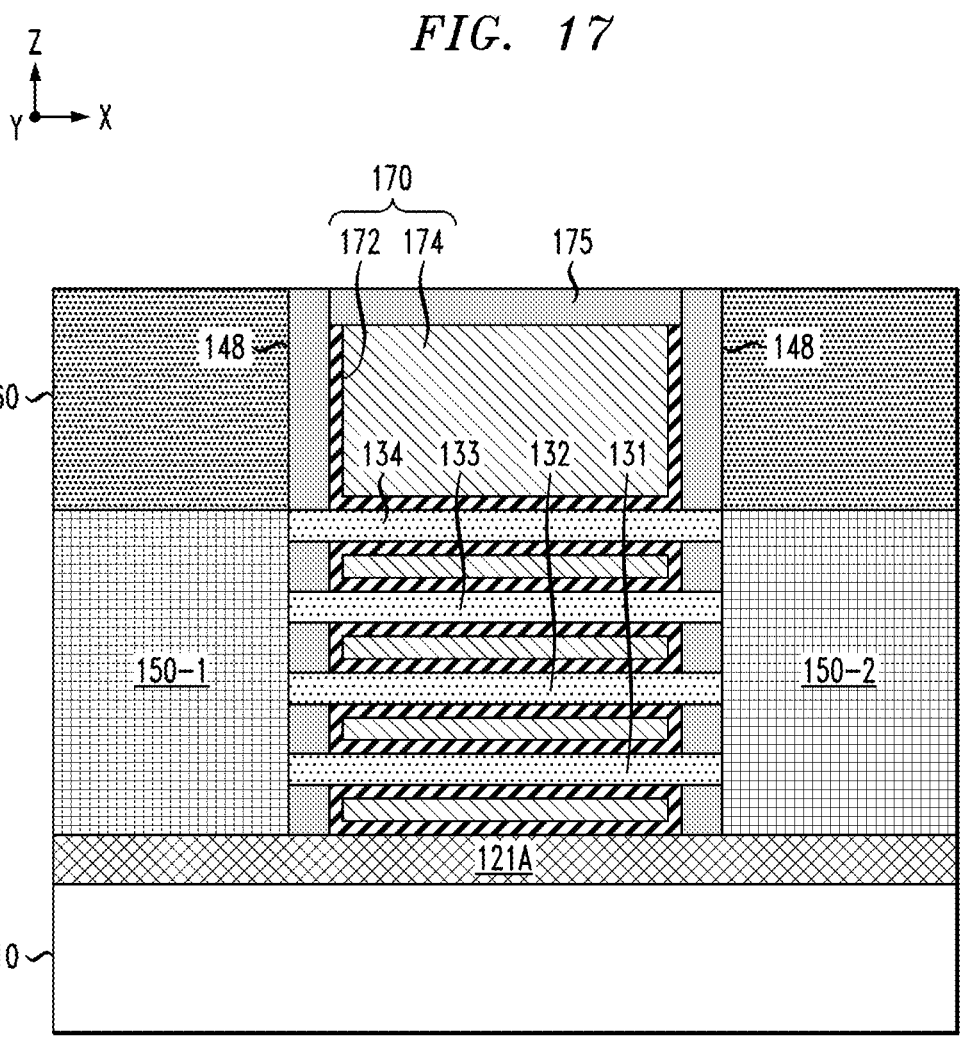

Following the deposition of the layer of conductive material 174A, a planarization process (e.g., CMP) is performed to polish the surface of the semiconductor structure down to the insulating layer 160, thereby removing overburden material of the layers 172 and 174A on the surface of the insulating layer 160. FIG. 17 is a cross-sectional schematic side view of the semiconductor structure shown in FIG. 16A after planarizing the semiconductor structure, recessing an upper portion of the metal gate structure 170, and forming the gate capping layer 175 on the recessed surface of the metal gate structure 170. The metal gate structure 170 can be recessed by forming an etch mask over the semiconductor structure with an opening to expose the upper surface region of the metal gate structure 170, followed by a RIE process to recess the upper surface of the metal gate structure 170. The gate capping layer 175 can be formed by removing etch mask and depositing a layer of dielectric material, such as silicon nitride, SiOCN, SiBCN, etc., over the semiconductor structure using a deposition process, including, but not limited to, PVD, CVD, PECVD, or any combination thereof. A CMP process can then be formed to remove the overburden dielectric material and planarize the surface of the semiconductor structure down to the insulating layer 160, resulting in the semiconductor structure shown in FIG. 17.

Following the formation of the semiconductor structure shown in FIG. 17, any known sequence of processing steps can be implemented to complete the fabrication the semiconductor integrated circuit device, the details of which are not needed to understand embodiments of the invention. Briefly, by way of example, a MOL process module can be implemented to form the vertical contacts 180-1 and 180-2 to the source/drain regions 150-1 and 150-2, resulting in the semiconductor structure 100 shown in FIGS. 1A and 1B. For example, the MOL process comprises etching contact openings in the insulating layer 160 down to the source/drain regions 150-1 and 150-2, and filling the contact openings with metallic material to form the vertical contacts 180-1 and 180-2 shown in FIG. 1A. The contact openings can be formed in the insulating layer 160 using any suitable patterning technique such as lithography followed by etching. The contact openings can be filled with a conductive material such as tungsten, cobalt, aluminum, or other conductive materials that are suitable for use in forming vertical device contacts in a MOL layer of the semiconductor device. Depending on the conductive material used to form the vertical contacts 180-1 and 180-2, a thin barrier diffusion layer may be deposited to line the contact openings to insulate the metallic material from the insulating layer 160. However, if the metallic material is formed of tungsten, for example, no liner layer may be needed as tungsten is not reactive with the dielectric materials that are typically used to form the insulating layer 160.

Furthermore, following the formation of the semiconductor structure shown in FIGS. 1A and 1B, any known sequence of processing steps can be implemented to complete the fabrication the semiconductor integrated circuit device, the details of which are not needed to understand embodiments of the invention. Briefly, by way of example, MOL processing can continue by patterning the gate capping layer 175 to form one or more openings that are filled with metallic material to form vertical gate contacts to the metal gate structure 170. Following formation of the device contacts (e.g., MOL contacts), a back-end-of-line (BEOL) interconnect structure is formed to provide connections to/between the vertical MOL contacts, and other active or passive devices that are formed as part of the FEOL layer.

Figure 18:
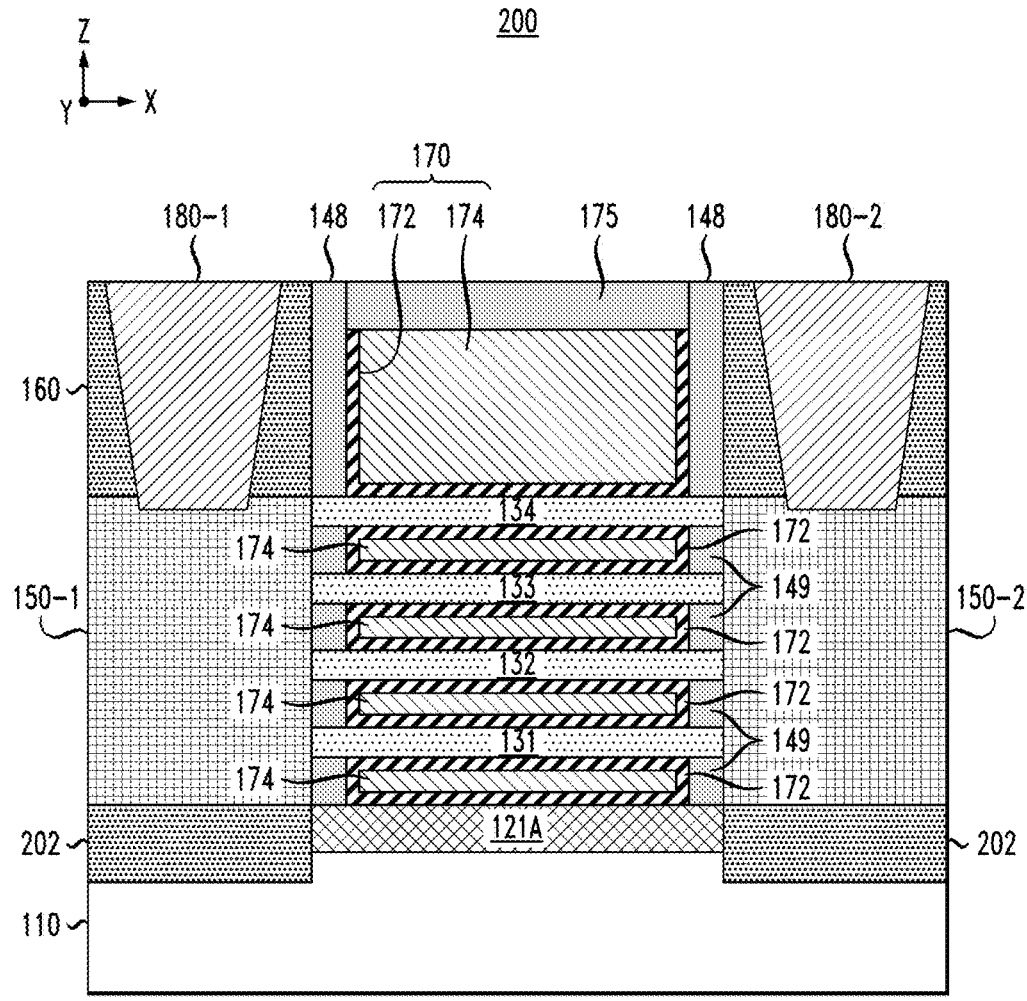
FIG. 18 is a schematic cross-sectional view of a semiconductor device comprising a nanosheet FET device according to another embodiment of the invention.

FIG. 18 is a schematic cross-sectional view of a semiconductor device 200 comprising a nanosheet FET device according to another embodiment of the invention. The semiconductor device 200 of FIG. 18 is similar to the semiconductor device 100 of FIGS. 1A and 1B, except for an isolation layer 202 (e.g., a shallow trench isolation (STI) structure) that is disposed between the bottom of the source/drain regions 150-1 and 150-2 and the semiconductor substrate 110. To fabricate the semiconductor device 200 shown in FIG. 18, in one embodiment of the invention, the semiconductor fabrication process flow discussed above can be modified at the intermediate stage shown in FIG. 10, by etching down the exposed portion of the REO layer 121A to the underlying substrate 110, and then recessing the substrate 100 below a bottom level of the REO layer 121A. A layer of insulating material (e.g., silicon oxide) is then deposited and patterned to form the isolation layer 202.

After forming the isolation layer 202, an epitaxy process is performed to grow the source/drain regions 150-1 and 150-2 on the exposed vertical sidewall surfaces of the semiconductor channel layers 131, 132, 133, and 134. With this embodiment, the epitaxial growth does not occur on the surface of the isolation layer 202, and the source/drain regions 150-1 and 150-2 are formed by merging the growth of the epitaxial semiconductor material on the vertical sidewall surfaces of the semiconductor channel layers 131, 132, 133, and 134. As such, a subsequent patterning process does not need to be performed to remove the excess epitaxial material in the field regions of the circuitry.

FIG. 18 illustrates an exemplary embodiment in which the isolation layer 202 (e.g., STI layer) is disposed under both source/drain regions 150-1 and 150-2. However, in another embodiment of the invention, when the source/drain regions of two adjacent nanosheet FET devices are to be commonly connected, the exposed portion of the REO layer 121A (in FIG. 10) can be patterned such that a portion of the REO layer 121A is maintained between the two adjacent nanosheet FET devices so that merger of the epitaxial semiconductor material can be achieved, in part, by the epitaxial growth of the semiconductor material on the portion of the REO layer 121A that is maintained between the two adjacent nanosheet FET devices. In this way, the resulting source/drain region, which is commonly shared by the two adjacent nanosheet FET devices, will be isolated from the substrate 110 by the underlying portion of the REO layer 121A.

In another embodiment of the invention, to fabricate the semiconductor device 200 shown in FIG. 18, the semiconductor fabrication process flow can be modified at the intermediate stage shown in FIGS. 3A, 3B, and 3C by recessing the exposed portion of the stack of nanosheet layers 115 (not covered by the etch mask 136) down to the surface of the semiconductor substrate 110, leaving no REO material of the REO layer 121A on the surface of the semiconductor substrate 110 expect for the portion of the REO layer 121A covered by the etch mask 136. After etching the stack of nanosheet layers 115, trenches are formed in the semiconductor substrate 110 between adjacent nanosheet stack structures. The trenches are filled by depositing a layer of insulating material, such as silicon oxide, and then recessing the layer of insulating material to a depth that is lower than an upper surface of the REO layer 121A, but higher than a bottom surface of the REO layer 121A.

Figure 19:
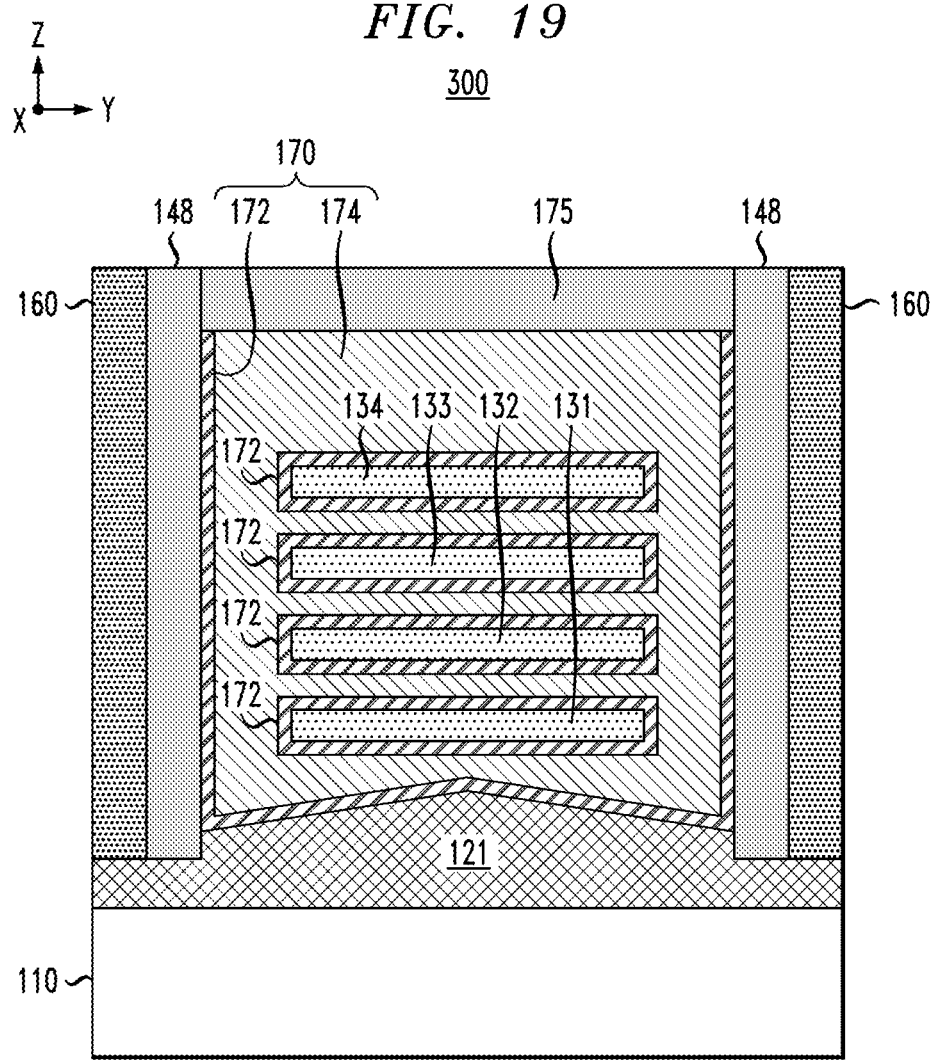
FIG. 19 is a schematic cross-sectional view of a semiconductor device comprising a nanosheet FET device according to yet another embodiment of the invention.

FIG. 19 is a schematic cross-sectional view of a semiconductor device 300 comprising a nanosheet FET device according to yet another embodiment of the invention. The semiconductor device 300 illustrated in FIG. 19 is similar to the semiconductor device 100 illustrated in FIG. 1B, except that the semiconductor device 300 in FIG. 19 comprises a REO layer 121 (isolation layer) which is formed of a single layer of REO material. In particular, with the semiconductor device 300 of FIG. 19, the first REO layer 121 of the stack of nanosheet layers 115 shown in FIG. 2 would be deposited as relatively thick, single layer of REO material (as opposed to the exemplary REO bi-layer 121A/121B shown in FIG. 2). In this embodiment, an upper portion of the REO layer 121 would serve as a sacrificial material which is etched to release the semiconductor channel layer 131, while a remaining portion of the REO layer 121 (as shown in FIG. 19) would serve as an isolation layer to isolate the nanosheet FET device from the semiconductor substrate 110. FIG. 19 illustrates that an upper surface of the REO layer, which is disposed within the gate region, comprises a non-planar surface (e.g., sloped concave surfaces) along the Y direction. As explained below, this results from an isotropic etch process that is used to etch away the sacrificial REO layers 122, 123, and 124, and an upper surface of the REO layer 121 to release the semiconductor channel layers 130.

Figure 20:
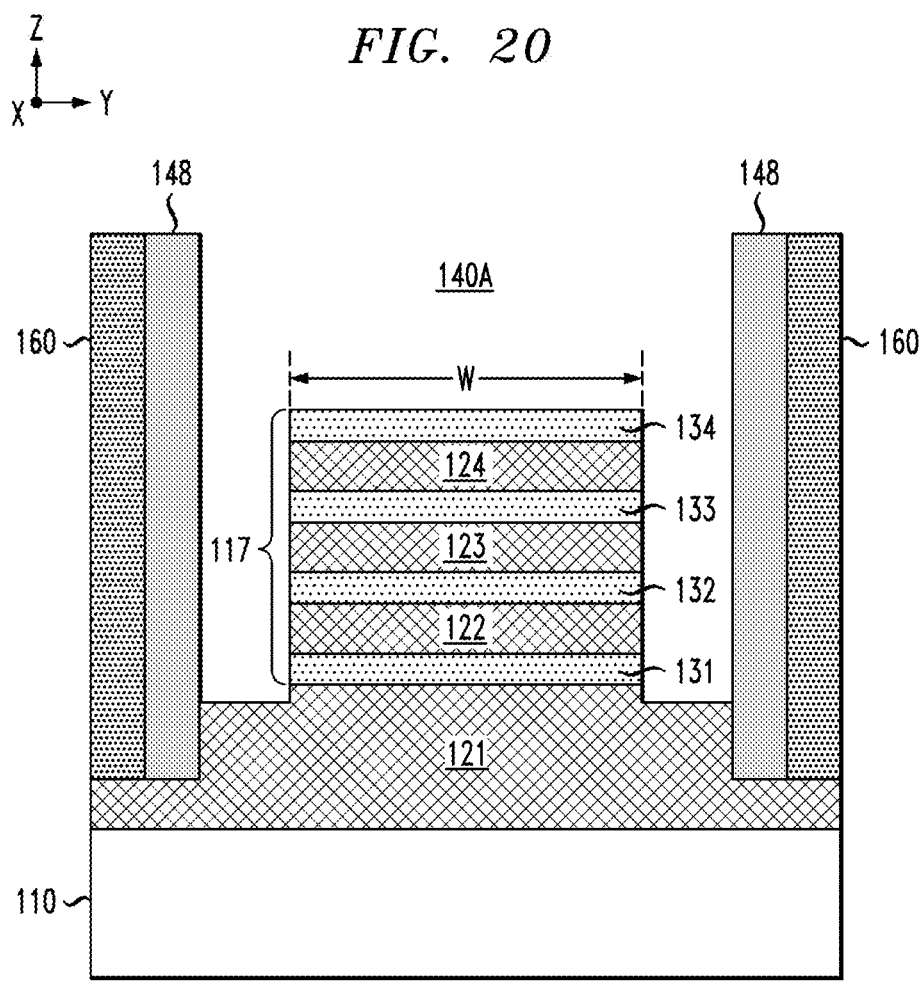
Figure 21:
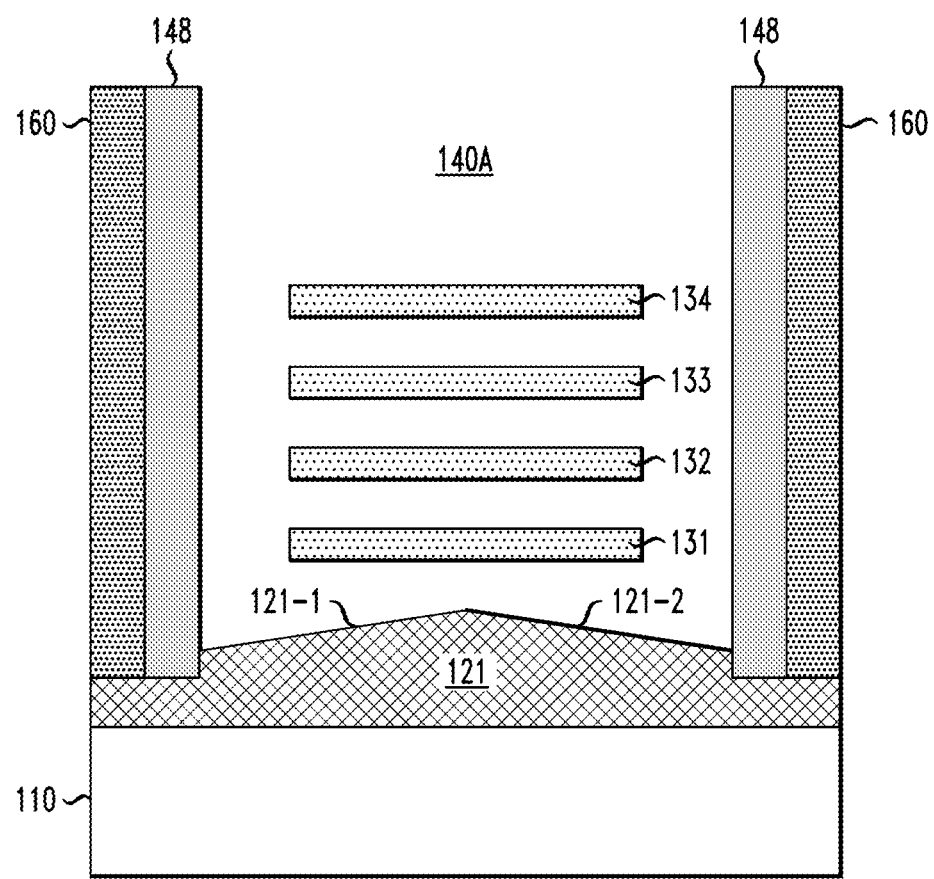

FIGS. 20 and 21 schematically illustrate an alternative process flow for fabricating the nanosheet FET device of FIG. 19. In particular, FIG. 20 is a cross-sectional schematic side view of an intermediate semiconductor structure that is formed after removing a dummy gate structure to form a gate recess region. In one example embodiment, FIG. 20 corresponds to the process stage shown in FIG. 13B, with the assumption that the REO layer 121 in FIG. 2 is formed as a single REO layer, and that the same or similar processing steps as shown and discussed above with reference to FIGS. 3A/3B/3C through FIGS. 13A/13B are performed to fabricate the intermediate semiconductor structure shown in FIG. 20. The single REO layer 121 is formed with an initial thickness which is greater than a thickness of the other REO layers 122, 123 and 124 to ensure that some portion of the single REO layer 121 remains following the etching/patterning steps that are subsequently performed at various stages of the process flow (e.g., recessing/etching in FIGS. 3A/3B/3C and 9), which result in a slight recessing of the upper portion of the single REO layer, resulting in the semiconductor structure shown in FIG. 20.

FIG. 21 is a cross-sectional schematic side view of the semiconductor structure of FIG. 20 after etching an upper portion of the REO layer 121 and etching away the sacrificial REO layers 122, 123, and 124 of the nanosheet stack to release the semiconductor channel layers 131, 132, 133, and 134. As shown in FIG. 21, an isotropic etch process results in the etched surface of the REO layer 121 (adjacent to the semiconductor channel layer 131) having a non-planar profile. In particular, the etched surface of the REO layer 121 comprises converging sloped surfaces 121-1 and 121-2 in the Y-Z direction, wherein each sloped surface 121-1 and 121-2 can have a concave-shaped profile as a result of the isotropic etch.

The non-planar surface profile of the REO layer 121 is due to the fact that REO etch starts at the edges of the REO layer 121 adjacent the gate insulating spacer 148, and propagates toward the center point of the gate recess region 140A. As a result, the remaining REO layer 121 will have a sloped/curved upper surface as more REO material is etched at the edges of the REO layer 121 as compared to the central region of the REO layer 121 at the termination of the etch process. This results in a larger spacing between the semiconductor channel layer 131 and the REO layer 121 at the ends of the semiconductor channel layer 131, and a smaller spacing between the semiconductor channel layer 131 and the REO layer 121 at the middle point of the semiconductor channel layer 131. The spacing between the semiconductor channel layer 131 and the REO layer 121 at the middle point of the semiconductor channel layer 131 should be sufficient to accommodate the formation of the high-k metal gate stack structures 172 and metal gate electrode layer 174 between the semiconductor channel layer 131 and the REO layer 121, as shown in FIG. 19.

It is to be understood that the methods discussed herein for fabricating nanosheet FET devices can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A semiconductor device, comprising:
   a nanosheet stack structure formed on a semiconductor substrate, wherein the nanosheet stack structure comprises a rare earth oxide (REO) layer formed on the semiconductor substrate, and a semiconductor channel layer disposed adjacent to the REO layer;
   a metal gate structure formed over the nanosheet stack structure;
   a gate insulating spacer disposed on vertical sidewalls of the metal gate structure, wherein end portions of the semiconductor channel layer are exposed through the gate insulating spacer; and
   a first source/drain region and a second source/drain region formed in contact with a respective one of the end portions of the semiconductor channel layer exposed through the gate insulating spacer;
   wherein a portion of the metal gate structure is disposed between the semiconductor channel layer and the REO layer, wherein the REO layer isolates the metal gate structure from the semiconductor substrate;
   wherein the first and second source/drain regions comprise an epitaxial semiconductor material that is epitaxially grown on the end portions of the semiconductor channel layer, and wherein the first and second source/drain regions are formed in contact with portions of the REO layer which extend past the gate insulating spacer such that the REO layer isolates the first and second source/drain regions from the semiconductor substrate.

2. The semiconductor device of claim 1, wherein the REO layer comprises an epitaxial REO material that is epitaxially grown on the semiconductor substrate, and wherein the semiconductor channel layer comprises an epitaxial semiconductor material that is epitaxially grown.

3. The semiconductor device of claim 1, wherein an upper surface of the REO layer which is adjacent to the semiconductor channel layer comprises a non-planar profile.

4. The semiconductor device of claim 1, wherein an upper surface of the REO layer which is adjacent to the semiconductor channel layer comprises a planar profile.

5. The semiconductor device of claim 1, wherein the metal gate structure comprises:
   a conformal gate dielectric layer formed on surfaces of the semiconductor channel layer; and
   one or more layers of metallic material formed on the conformal gate dielectric layer and filling a gate region surrounded by the gate insulating spacer;
   wherein the one or more layers of metallic material comprises at least one of a work function metal layer and a gate electrode layer.

6. A semiconductor device, comprising:
   a nanosheet stack structure formed on a semiconductor substrate, wherein the nanosheet stack structure comprises a rare earth oxide (REO) layer formed on the semiconductor substrate, and a semiconductor channel layer disposed adjacent to the REO layer;
   a metal gate structure formed over the nanosheet stack structure;
   a gate insulating spacer disposed on vertical sidewalls of the metal gate structure, wherein end portions of the semiconductor channel layer are exposed through the gate insulating spacer; and
   a first source/drain region and a second source/drain region formed in contact with a respective one of the end portions of the semiconductor channel layer exposed through the gate insulating spacer;
   wherein a portion of the metal gate structure is disposed between the semiconductor channel layer and the REO layer, wherein the REO layer isolates the metal gate structure from the semiconductor substrate;
   wherein at least one of the first source/drain region and the second source/drain region is formed in contact with a portion of the REO layer which extends past the gate insulating spacer; and
   wherein said at least one of the first source/drain region and the second source/drain region, which is formed in contact with the portion of the REO layer that extends past the gate insulating spacer, is isolated from the semiconductor substrate by the REO layer.

7. The semiconductor device of claim 6, wherein the REO layer comprises an epitaxial REO material that is epitaxially grown on the semiconductor substrate, and wherein the semiconductor channel layer comprises an epitaxial semiconductor material that is epitaxially grown.

8. The semiconductor device of claim 6, wherein the first and second source/drain regions comprise an epitaxial semiconductor material that is epitaxially grown on the end portions of the semiconductor channel layer.

9. The semiconductor device of claim 6, further comprising an isolation layer formed in the surface of the semiconductor substrate adjacent to at least one side of the nanosheet stack structure, wherein at least one of the first source/drain region and the second source/drain region is disposed on the isolation layer and isolated from the semiconductor substrate by the isolation layer.

10. The semiconductor device of claim 6, wherein an upper surface of the REO layer which is adjacent to the semiconductor channel layer comprises a non-planar profile.

11. The semiconductor device of claim 6, wherein an upper surface of the REO layer which is adjacent to the semiconductor channel layer comprises a planar profile.

12. The semiconductor device of claim 6, wherein the metal gate structure comprises:
   a conformal gate dielectric layer formed on surfaces of the semiconductor channel layer; and
   one or more layers of metallic material formed on the conformal gate dielectric layer and filling a gate region surrounded by the gate insulating spacer;

wherein the one or more layers of metallic material comprises at least one of a work function metal layer and a gate electrode layer.

* * * * *